United States Patent
Takahashi et al.

(10) Patent No.: US 10,957,720 B2
(45) Date of Patent: Mar. 23, 2021

(54) SEMICONDUCTOR DEVICE, DISPLAY DEVICE, AND ELECTRONIC DEVICE

(71) Applicant: Semiconductor Energy Laboratory Co., Ltd., Atsugi (JP)

(72) Inventors: Kei Takahashi, Isehara (JP); Susumu Kawashima, Atsugi (JP); Koji Kusunoki, Isehara (JP); Kazunori Watanabe, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/760,495

(22) PCT Filed: Oct. 29, 2018

(86) PCT No.: PCT/IB2018/058424
§ 371 (c)(1),
(2) Date: Apr. 30, 2020

(87) PCT Pub. No.: WO2019/092540
PCT Pub. Date: May 16, 2019

(65) Prior Publication Data
US 2020/0258921 A1 Aug. 13, 2020

(30) Foreign Application Priority Data

Nov. 9, 2017 (JP) .............................. JP2017-216032
Nov. 23, 2017 (JP) .............................. JP2017-225265

(51) Int. Cl.
*G09G 3/36* (2006.01)
*H01L 27/12* (2006.01)
*H03M 1/68* (2006.01)

(52) U.S. Cl.
CPC ....... *H01L 27/1255* (2013.01); *G09G 3/3648* (2013.01); *H01L 27/124* (2013.01);
(Continued)

(58) Field of Classification Search
CPC .................................................. G09G 3/3648
See application file for complete search history.

(56) References Cited

U.S. PATENT DOCUMENTS

| 6,563,480 B1 | 5/2003 | Nakamura |
| 7,674,650 B2 | 3/2010 | Akimoto et al. |

(Continued)

FOREIGN PATENT DOCUMENTS

| CN | 101887689 A | 11/2010 |
| CN | 102654979 A | 9/2012 |

(Continued)

OTHER PUBLICATIONS

International Search Report (Application No. PCT/IB2018/058424) dated Feb. 26, 2019.

(Continued)

Primary Examiner — Edmond C Lau
(74) Attorney, Agent, or Firm — Robinson Intellectual Property Law Office; Eric J. Robinson

(57) ABSTRACT

To provide a display device having a small circuit area and low power consumption. The display device includes a semiconductor device and a D/A converter circuit, and the semiconductor device includes first to third transistors and first and second capacitors. A first terminal of the first transistor is electrically connected to a first terminal of the first capacitor. A first terminal of the second transistor is electrically connected to a gate of the third transistor, a second terminal of the first capacitor, and a first terminal of the second capacitor. A first terminal of the third transistor is electrically connected to a second terminal of the second capacitor. An output terminal of the D/A converter circuit is electrically connected to a second terminal of the first transistor and a second terminal of the second transistor. Supply of a potential to the first terminal of the first capacitor changes (finely adjusts) the potential of the gate of the third (Continued)

transistor to be more precise than a potential that can be output from the D/A converter circuit.

11 Claims, 15 Drawing Sheets

(52) U.S. Cl.
CPC ...... *H01L 27/1218* (2013.01); *H01L 27/1259* (2013.01); *H03M 1/68* (2013.01); *G09G 2300/0408* (2013.01); *G09G 2300/0828* (2013.01)

(56) References Cited

U.S. PATENT DOCUMENTS

| | | | |
|---|---|---|---|
| 8,462,145 | B2 | 6/2013 | Kim et al. |
| 8,476,625 | B2 | 7/2013 | Kimura |
| 8,860,108 | B2 | 10/2014 | Yamazaki et al. |
| 10,140,940 | B2 | 11/2018 | Aoki |
| 2009/0135323 | A1 | 5/2009 | Yang et al. |
| 2009/0295691 | A1 | 12/2009 | Handa et al. |
| 2010/0289830 | A1 | 11/2010 | Yamamoto et al. |
| 2012/0223978 | A1 | 9/2012 | Yamamoto et al. |
| 2012/0249509 | A1 | 10/2012 | Kim et al. |
| 2015/0310806 | A1* | 10/2015 | Hu ............... G09G 3/3266 345/78 |
| 2015/0356916 | A1* | 12/2015 | Qian ............... G09G 3/325 345/78 |
| 2016/0189799 | A1* | 6/2016 | Cao ............... G11C 19/287 377/64 |
| 2016/0307518 | A1 | 10/2016 | Kimura et al. |
| 2017/0045787 | A1 | 2/2017 | Kita et al. |
| 2020/0193928 | A1 | 6/2020 | Kawashima et al. |
| 2020/0194527 | A1 | 6/2020 | Kawashima et al. |

FOREIGN PATENT DOCUMENTS

| | | |
|---|---|---|
| JP | 2007-096055 A | 4/2007 |
| JP | 2009-288734 A | 12/2009 |
| JP | 2010-156963 A | 7/2010 |
| JP | 2010-266494 A | 11/2010 |
| JP | 2012-185328 A | 9/2012 |
| JP | 2016-206659 A | 12/2016 |
| KR | 2009-0125703 A | 12/2009 |
| KR | 2010-0122443 A | 11/2010 |
| TW | 201106323 | 2/2011 |

OTHER PUBLICATIONS

Written Opinion (Application No. PCT/IB2018/058424) dated Feb. 26, 2019.

Amano.S et al., "Low Power LC Display Using In-Ga-Zn-Oxide TFTs Based on Variable Frame Frequency", SID Digest '10 : SID International Symposium Digest of Technical Papers, May 23, 2010, vol. 41, No. 1, pp. 626-629.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Kato.K et al., "Evaluation of Off-State Current Characteristics of Transistor Using Oxide Semiconductor Material, Indium-Gallium-Zinc Oxide", JPN. J. APPL. PHYS. (Japanese Journal of Applied Physics) 2012, vol. 51, pp. 021201-1-021201-7.

Yamazaki.S et al., "Properties of crystalline In-Ga-Zn-oxide semiconductor and its transistor characteristics", JPN. J. APPL. PHYS. (Japanese Journal of Applied Physics), Mar. 31, 2014, vol. 53, No. 4S, pp. 04ED18-1-04ED18-10.

Yamazaki.S et al., "In-Ga-Zn-Oxide Semiconductor and Its Transistor Characteristics", Ecs Journal of.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Matsuda.S et al., "30-nm-Channel-Length C-Axis Aligned Crystalline In-Ga-Zn-O Transistors with Low Off-State Leakage Current and Steep Subthreshold Characteristics", 2015 Symposium on VLSI Technology: Digest of Technical Papers, 20115, pp. T216-T217.

Ito.S et al., "Analysis of Nanoscale Crystalline Structure of In-Ga-Zn-O Thin Film with Nano Beam Electron Diffraction", AM-FPD '13 Digest of Technical Papers, Jul. 2, 2013, pp. 151-154.

* cited by examiner

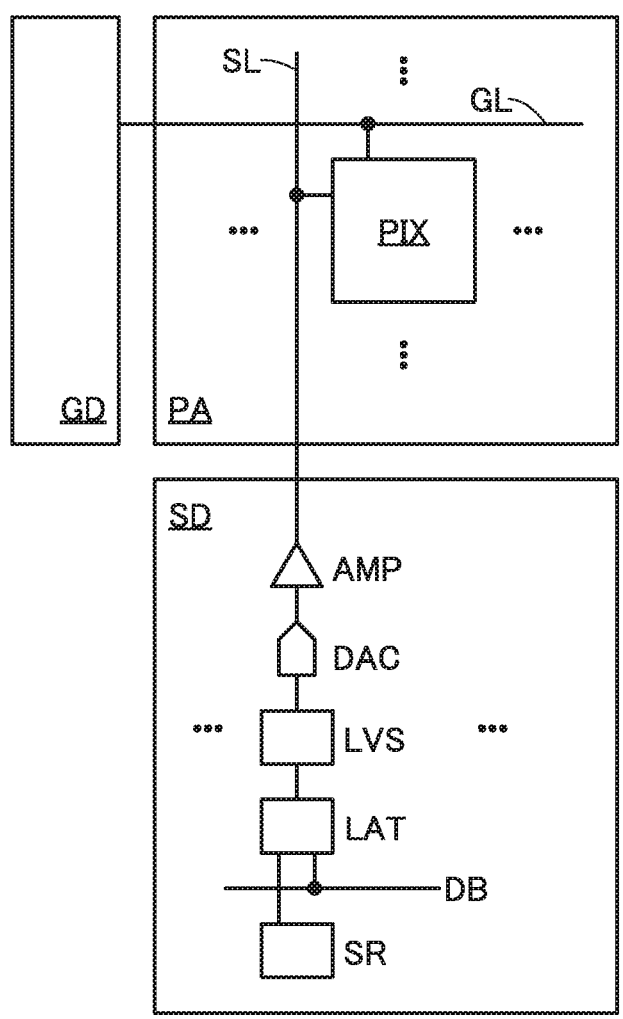

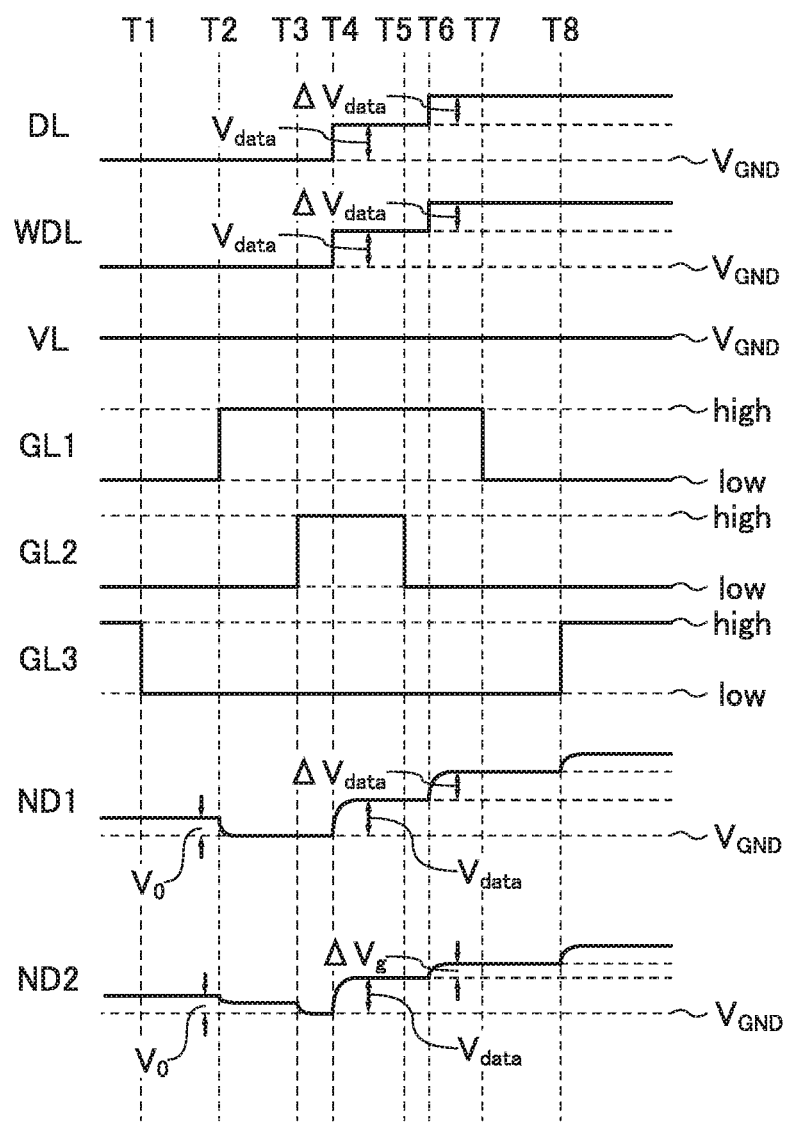

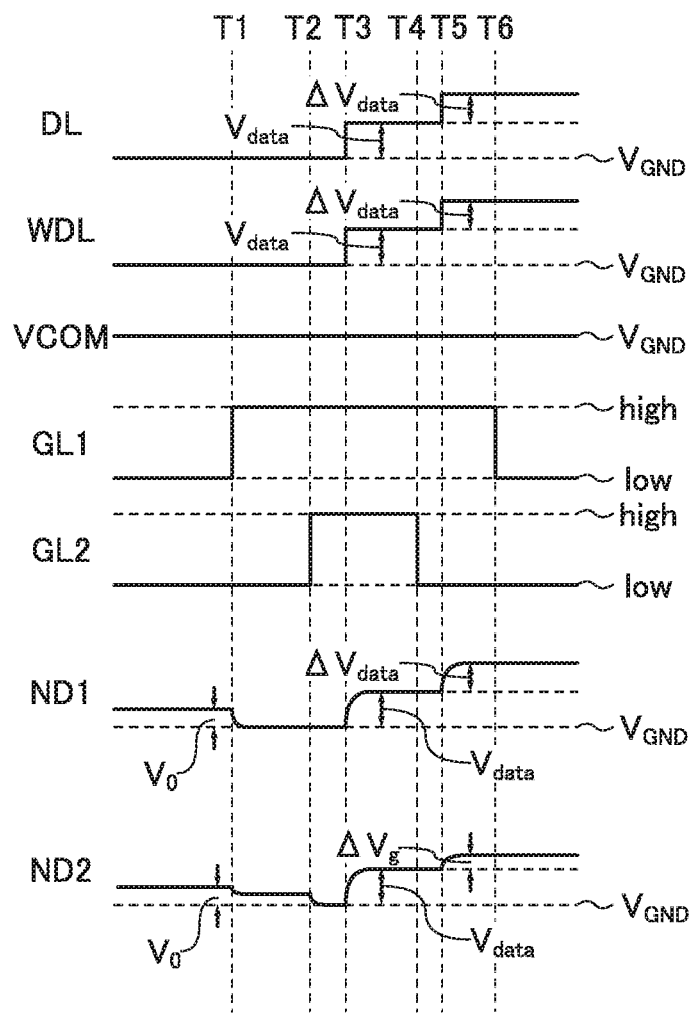

FIG. 12A1
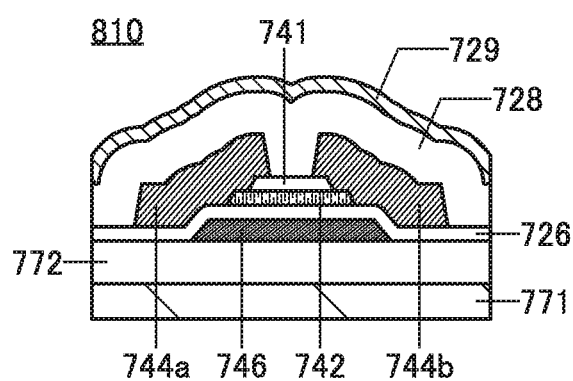
FIG. 12A2
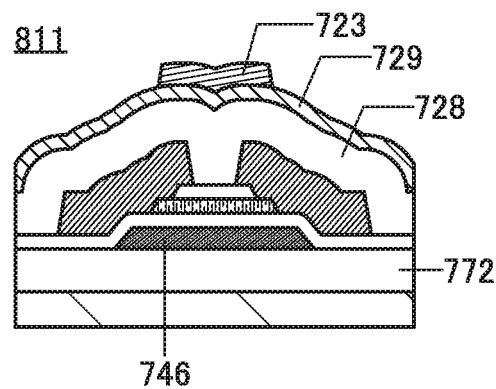
FIG. 12B1
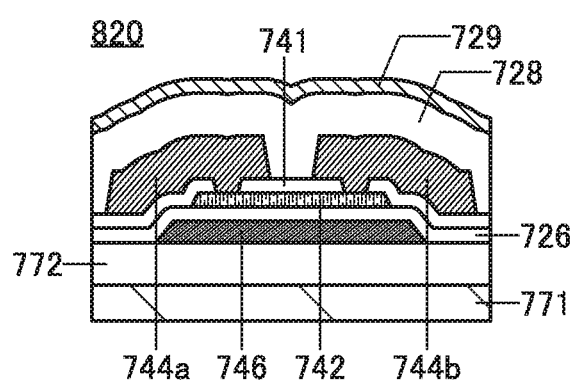
FIG. 12B2
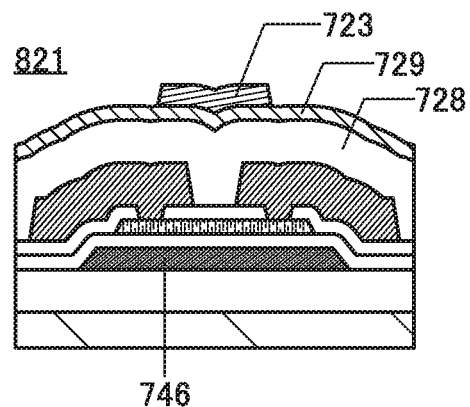
FIG. 12C1
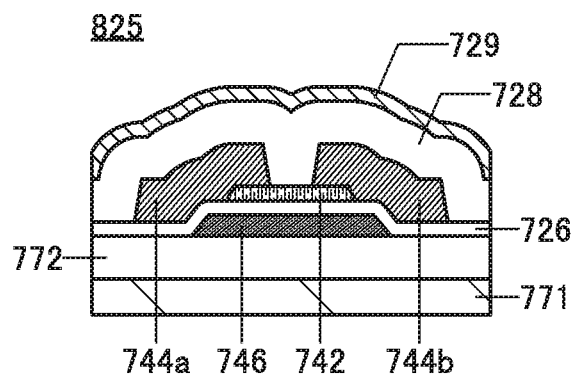
FIG. 12C2
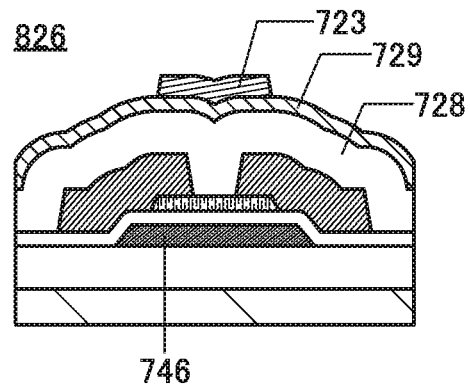

FIG. 13A1
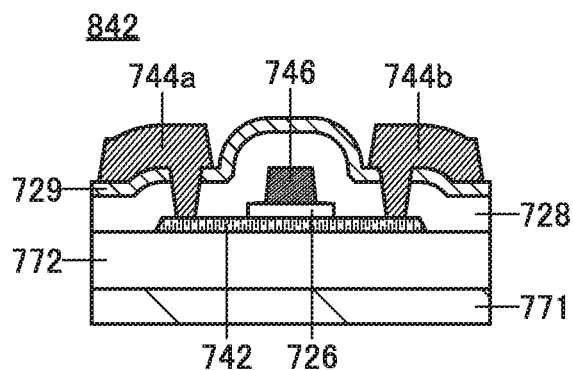
FIG. 13A2
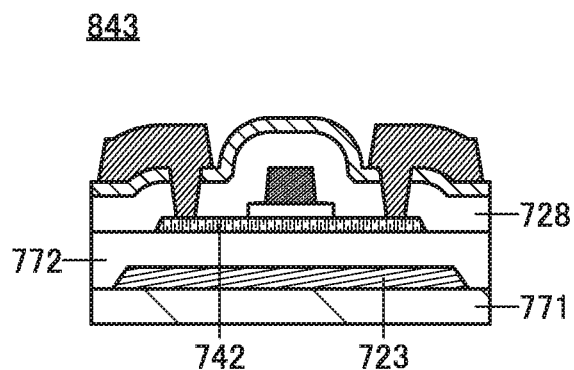
FIG. 13A3
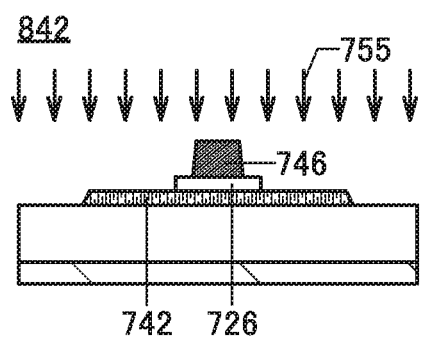
FIG. 13B1
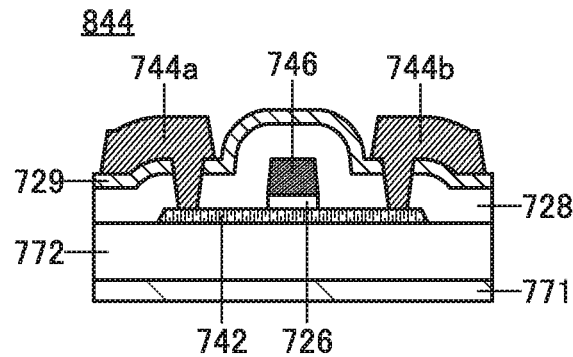
FIG. 13B2
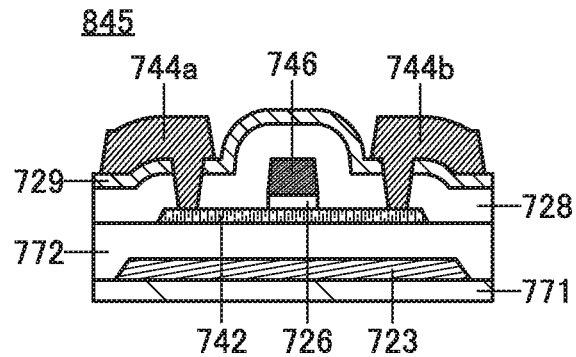
FIG. 13C1
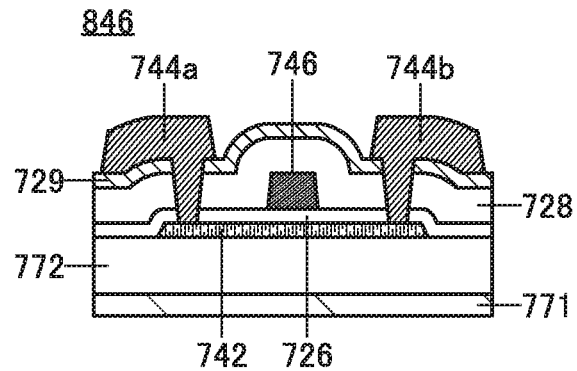
FIG. 13C2
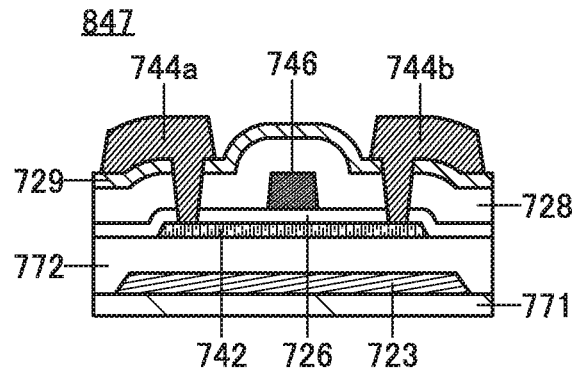

SEMICONDUCTOR DEVICE, DISPLAY DEVICE, AND ELECTRONIC DEVICE

TECHNICAL FIELD

Embodiments of the present invention relate to a semiconductor device, a display device, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a processor, an electronic device, a system, a method for driving any of them, a method for manufacturing any of them, and a method for inspecting any of them.

BACKGROUND ART

Display devices included in mobile phones such as smartphones, tablet information terminals, notebook personal computers (PC), portable game consoles, and the like have undergone various improvements in recent years. For example, there have been developed display devices with features such as higher resolution, higher color reproducibility, a smaller driver circuit, and lower power consumption. For example, Patent Document 1 discloses the invention of a source driver IC of a display device that includes a liquid crystal element and uses a multi-tone linear D/A converter circuit to display a multi-tone image.

Another example is a technique of using a transistor including an oxide semiconductor in a semiconductor thin film, as a switching element included in a pixel circuit of a display device.

As semiconductor thin films that can be used for transistors, silicon-based semiconductor materials are widely used, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a c-axis aligned crystalline (CAAC) structure and a nanocrystalline (nc) structure, which are not single crystal nor amorphous, have been found (see Non-Patent Documents 1 to 3). In Non-Patent Documents 1 and 2, a technique for forming a transistor using an oxide semiconductor having a CAAC structure is disclosed. Moreover, Non-Patent Documents 4 and 5 disclose that a fine crystal is included even in an oxide semiconductor that has lower crystallinity than the CAAC structure and the nc structure.

In addition, a transistor that includes IGZO as an active layer has an extremely low off-state current (see Non-Patent Document 6), and an LSI and a display device that utilize the characteristics have been reported (see Non-Patent Documents 7 and 8). Patent Document 2 discloses the invention in which a transistor including IGZO in an active layer is used in a pixel circuit of a display device.

REFERENCES

Patent Documents

[Patent Document 1] U.S. Pat. No. 8,462,145
[Patent Document 2] Japanese Published Patent Application No. 2010-156963

Non-Patent Documents

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

DISCLOSURE OF INVENTION

To display a high-quality image, a display device is required to have high resolution and a wide color gamut and express a multi-step gradation, for example. In a display device including a light-emitting element such as an organic electroluminescence (EL) element or a liquid crystal element such as a transmissive liquid crystal element or a reflective liquid crystal element, a source driver circuit needs to be suitably designed so that a multi-tone image can be displayed.

To deal with multi-tone image data, the resolving power of a D/A converter circuit in a source driver circuit needs to be high. A D/A converter circuit having higher resolving power can output analog values (voltages) in smaller steps. In the case where a D/A converter circuit having high resolving power is designed, however, the area of the D/A converter circuit increases.

An object of one embodiment of the present invention is to provide a pixel circuit capable of generating multi-tone image data (the pixel circuit is referred to as a semiconductor device in this specification and the like). Another object of one embodiment of the present invention is to provide a display device including the semiconductor device. Another object of one embodiment of the present invention is to provide an electronic device including the display device.

Another object of one embodiment of the present invention is to provide a display device including a source driver circuit with a small circuit area. Another object of one embodiment of the present invention is to provide a display device including a source driver circuit having low power consumption.

Note that the objects of one embodiment of the present invention are not limited to the objects mentioned above. The objects described above do not preclude the existence of other objects. The other objects are the ones that are not described above and will be described below. The other objects that are not described above will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including a first transistor, a second transistor, a third transistor, a first capacitor, and a second capacitor. A first terminal of the first transistor is electrically connected to a first terminal of the first capacitor. A first terminal of the second transistor is electrically connected to a gate of the third transistor, a second terminal of the first capacitor, and a first terminal of the second capacitor. A first terminal of the third transistor is electrically connected to a second terminal of the second capacitor. The semiconductor device has first to fourth functions. The first function includes a function of writing a first potential to the first terminal of the first capacitor by turning on the first transistor, and a function of writing a second potential to the gate of the third transistor, the second terminal of the first capacitor, and the first terminal of the second capacitor by turning on the second transistor. The second function includes a function of holding the second potential of the gate of the third transistor at the second terminal of the first capacitor and the first terminal of the second capacitor by turning off the second transistor. The third function includes a function of writing the sum of the first potential and a third potential to the first terminal of the first capacitor, and a function of changing the second potential held at the gate of the third transistor, the second terminal of the first capacitor, and the first terminal of the second capacitor to the sum of the second potential and a fourth potential when the sum of the first potential and the third potential is written to the first terminal of the first capacitor. The fourth function includes a function of supplying a current corresponding to the sum of the second potential and the fourth potential between the first terminal and a second terminal of the third transistor. The second potential corresponds to upper bits of data. The fourth potential corresponds to lower bits of data.

(2) Another embodiment of the present invention is the semiconductor device having the structure of (1) in which at least one of the first to third transistors includes a metal oxide in a channel formation region.

(3) Another embodiment of the present invention is the semiconductor device having the structure of (1) or (2) further including a fourth transistor and a light-emitting element. A first terminal of the fourth transistor is electrically connected to the first terminal of the third transistor and the second terminal of the second capacitor. An input terminal of the light-emitting element is electrically connected to a second terminal of the fourth transistor.

(4) Another embodiment of the present invention is the semiconductor device having the structure of (3) in which the fourth transistor includes a metal oxide in a channel formation region.

(5) Another embodiment of the present invention is a semiconductor device including a first transistor, a second transistor, a first capacitor, and a second capacitor. A first terminal of the first transistor is electrically connected to a first terminal of the first capacitor. A first terminal of the second transistor is electrically connected to a second terminal of the first capacitor and a first terminal of the second capacitor. The semiconductor device has first to third functions. The first function includes a function of writing a first potential to the first terminal of the first capacitor by turning on the first transistor, and a function of writing a second potential to the second terminal of the first capacitor and the first terminal of the second capacitor by turning on the second transistor. The second function includes a function of holding the second potential of the second terminal of the first capacitor and the first terminal of the second capacitor by turning off the second transistor. The third function includes a function of writing a sum of the first potential and the third potential to the first terminal of the first capacitor, and a function of changing the second potential held at the second terminal of the first capacitor and the first terminal of the second capacitor to the sum of the second potential and the fourth potential when the sum of the first potential and the third potential is written to the first terminal of the first capacitor. The second potential corresponds to upper bits of data. The fourth potential corresponds to lower bits of data.

(6) Another embodiment of the present invention is the semiconductor device having the structure of (5) in which at least one of the first and second transistors includes a metal oxide in a channel formation region.

(7) Another embodiment of the present invention is the semiconductor device having the structure of (5) or (6) further including a liquid crystal element. An input terminal of the liquid crystal element is electrically connected to the first terminal of the second transistor.

(8) Another embodiment of the present invention is a display device including the semiconductor device having the structure of any one of (1) to (7) and a D/A converter circuit. An output terminal of the D/A converter circuit is electrically connected to the first terminal of the first transistor and the first terminal of the second transistor. The D/A converter circuit is configured to generate a first potential, a second potential, or a sum of the first potential and a third potential and output the first potential, the second potential, or the sum of the first potential and the third potential from the output terminal of the D/A converter circuit.

(9) Another embodiment of the present invention is an electronic device including the display device having the structure of (8) and a housing.

One embodiment of the present invention can provide a semiconductor device capable of generating multi-tone image data. Another embodiment of the present invention can provide a display device including the semiconductor device. Another embodiment of the present invention can provide an electronic device including the display device.

Another embodiment of the present invention can provide a display device including a source driver circuit with a small circuit area. Another embodiment of the present invention can provide a display device including a source driver circuit having low power consumption.

Note that the effects of one embodiment of the present invention are not limited to the effects mentioned above. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF DRAWINGS

FIG. 1 is a block diagram illustrating an example of a display device.

FIG. 4 is a timing chart showing an operation example of a pixel.

FIG. 7 is a timing chart showing an operation example of a pixel.

FIGS. 12A1, 12A2, 12B1, 12B2, 12C1, and 12C2 are cross-sectional views each illustrating a structure example of a transistor.

FIGS. 13A1, 13A2, 13A3, 13B1, 13B2, 13C1, and 13C2 are cross-sectional views each illustrating a structural example of a transistor.

BEST MODE FOR CARRYING OUT THE INVENTION

Figure 2A:
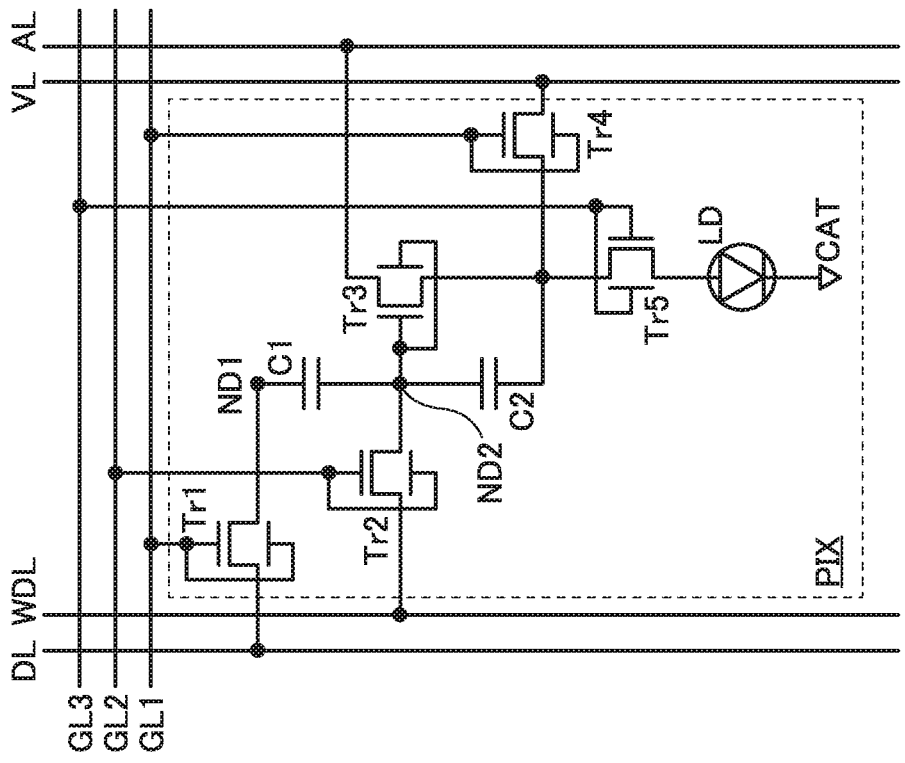
FIGS. 2A and 2B are circuit diagrams each illustrating an example of a pixel.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, a metal oxide included in a channel formation region of a transistor that has at least one of an amplifying function, a rectifying function, and a switching function can be referred to as a metal oxide semiconductor or shortly as an OS. An OS FET (or an OS transistor) refers to a transistor including a metal oxide or an oxide semiconductor.

In this specification and the like, a metal oxide containing nitrogen is also referred to as a metal oxide in some cases. Moreover, a metal oxide containing nitrogen may be referred to as a metal oxynitride.

Embodiment 1

In this embodiment, a semiconductor device of one embodiment of the present invention and a display device including the semiconductor device will be described.

Circuit Configuration of Display Device

First, a configuration example of a display device will be described. FIG. 1 is a block diagram illustrating an example of a display device including a liquid crystal element or a light-emitting element such as an inorganic EL element or an organic EL element. A display device DD includes a display portion PA, a source driver circuit SD, and a gate driver circuit GD.

The display portion PA includes a plurality of pixels PIX. Note that only one of the pixels PIX in the display portion PA is illustrated and the rest of the pixels PIX are not illustrated in FIG. 1. The pixels PIX in the display portion PA are preferably arranged in a matrix.

In FIG. 1, the pixel PIX is electrically connected to the source driver circuit SD through a wiring SL. In addition, the pixel PIX is electrically connected to the gate driver circuit GD through a wiring GL. Since the display portion PA includes the plurality of pixels PIX, more than one pixel PIX may be electrically connected to the wiring SL. Similarly, more than one pixel PIX may be electrically connected to the wiring GL. Furthermore, more than one wiring SL and more than one wiring GL may be provided in accordance with the number of the pixels PIX in the display portion PA. Depending on the circuit configuration of the pixel PIX, more than one wiring SL or more than one wiring GL may be electrically connected to one pixel PIX.

The pixel PIX can include one or more subpixels. The pixel PIX can include, for example, one subpixel (any one of a red (R) subpixel, a green (G) subpixel, a blue (B) subpixel, and a white (W) subpixel, for example), three subpixels (e.g., red (R), green (G), and blue (B) subpixels), or four subpixels (e.g., red (R), green (G), blue (B), and white (W) subpixels, or red (R), green (G), blue (B), and yellow (Y) subpixels). Note that color elements used for the subpixels are not limited to the above, and may be used in combination with another color element such as a cyan (C) element or a magenta (M) element as necessary.

The source driver circuit SD has a function of generating image data to be input to the pixel PIX in the display portion PA and a function of transmitting the image data to the pixel PIX.

The source driver circuit SD can include, for example, a shift register SR, a latch circuit LAT, a level shifter circuit LVS, a D/A converter circuit DAC, an amplifier circuit AMP, and a data bus wiring DB. In FIG. 1, an output terminal of the shift register SR is electrically connected to a clock input terminal of the latch circuit LAT; an input terminal of the latch circuit LAT is electrically connected to the data bus wiring DB; an output terminal of the latch circuit LAT is electrically connected to an input terminal of the level shifter circuit LVS; an output terminal of the level shifter circuit LVS is electrically connected to an input terminal of the D/A converter circuit DAC; an output terminal of the D/A converter circuit DAC is electrically connected to an input terminal of the amplifier circuit AMP; and an output terminal of the amplifier circuit AMP is electrically connected to the display portion PA.

Note that the latch circuit LAT, the level shifter circuit LVS, the D/A converter circuit DAC, and the amplifier circuit AMP that are illustrated in FIG. 1 are provided for one wiring SL. That is, the numbers of the latch circuits LAT, the level shifter circuits LVS, the D/A converter circuits DAC, and the amplifier circuits AMP each need to be more than one, depending on the number of the wirings SL. In this case, the shift register SR is configured to sequentially send pulse signals to the clock input terminal of each of the plurality of latch circuits LAT.

The data bus wiring DB is for sending a digital signal containing image data to be input to the display portion PA. The image data has gray levels; as the number of gray levels increases, variations in color or brightness can be expressed with a more smooth gradation and a more natural image can be displayed on the display portion PA. On the other hand, an increase in the number of gray levels increases the volume of image data, and a D/A converter circuit with high resolving power needs to be used.

A digital signal containing image data is input from the data bus wiring DB to the input terminal of the latch circuit LAT. Then, the latch circuit LAT retains the image data or outputs the retained image data from the output terminal, in response to a signal sent from the shift register SR.

The level shifter circuit LVS has a function of converting an input signal into an output signal with a higher or lower amplitude voltage. The level shifter circuit LVS illustrated in FIG. 1 has a function of converting the amplitude voltage of a digital signal containing image data that is sent from the latch circuit LAT into an amplitude voltage at which the D/A converter circuit DAC properly operates.

The D/A converter circuit DAC has a function of converting an input digital signal containing image data into an analog signal and a function of outputting the analog signal from the output terminal. In particular, in the case where multi-tone image data is displayed on the display portion PA, the D/A converter circuit DAC needs to have high resolving power.

The amplifier circuit AMP has a function of amplifying an analog signal input through the input terminal and outputting the amplified signal to the output terminal. The amplifier circuit AMP is provided between the D/A converter circuit DAC and the display portion PA; thus, image data can be stably transmitted to the display portion PA. A voltage follower circuit including an operational amplifier and the like can be used as the amplifier circuit AMP. Note that in the case where a circuit including a differential input circuit is used as an amplifier circuit, the offset voltage of the differential input circuit is preferably set as close to 0 V as possible.

Through the above operations, the source driver circuit SD can convert the digital signal containing image data that has been sent from the data bus wiring DB into an analog signal and send the analog signal to the display portion PA.

The gate driver circuit GD has a function of selecting any of the plurality of pixels PIX in the display portion PA to which image data is input.

To input image data to the display portion PA, the gate driver circuit GD sends a selection signal to the plurality of pixels PIX electrically connected to one wiring GL so that image data write switching elements included in the plurality of pixels PIX are turned on, and then, transmits image data from the source driver circuit SD to the plurality of pixels PIX through the wirings SL.

Note that one embodiment of the present invention is not limited to the configuration of the display device DD in FIG. 1. One embodiment of the present invention can be obtained by appropriately varying a component of the display device DD according to the conditions such as the design specifications and the purpose, for example.

In the case where a multi-tone image is displayed on the display portion PA, the D/A converter circuit DAC needs to have high resolving power. In that case, the size of the D/A converter circuit DAC increases; thus, the circuit area of the source driver circuit SD may increase. When circuit elements in a circuit included in the source driver circuit SD, such as a transistor and a capacitor, are made small to reduce the circuit area of the source driver circuit SD, the electrical characteristics of the circuit elements might be adversely affected by an influence of parasitic resistance, an influence of a variation in structure caused in fabrication of the circuit elements, or the like.

Circuit Configuration of Pixels

In view of the above, one embodiment of the present invention is configured to change the potential of an image data storage portion of the pixel PIX to be more precise than a potential that can be output from the D/A converter circuit DAC, utilizing capacitive coupling. In other words, according to one embodiment of the present invention, potentials can be supplied to the image data storage portion of the pixel PIX in smaller steps than potentials that can be output from the D/A converter circuit DAC. Thus, the resolving power of the D/A converter circuit does not need to be high, and the D/A converter circuit with low resolving power can be used. Consequently, the circuit area of the source driver circuit SD including the D/A converter circuit DAC can be reduced, and the power consumption of the source driver circuit SD can be reduced.

Pixel PIX Including Light-Emitting Element

Figure 2B:
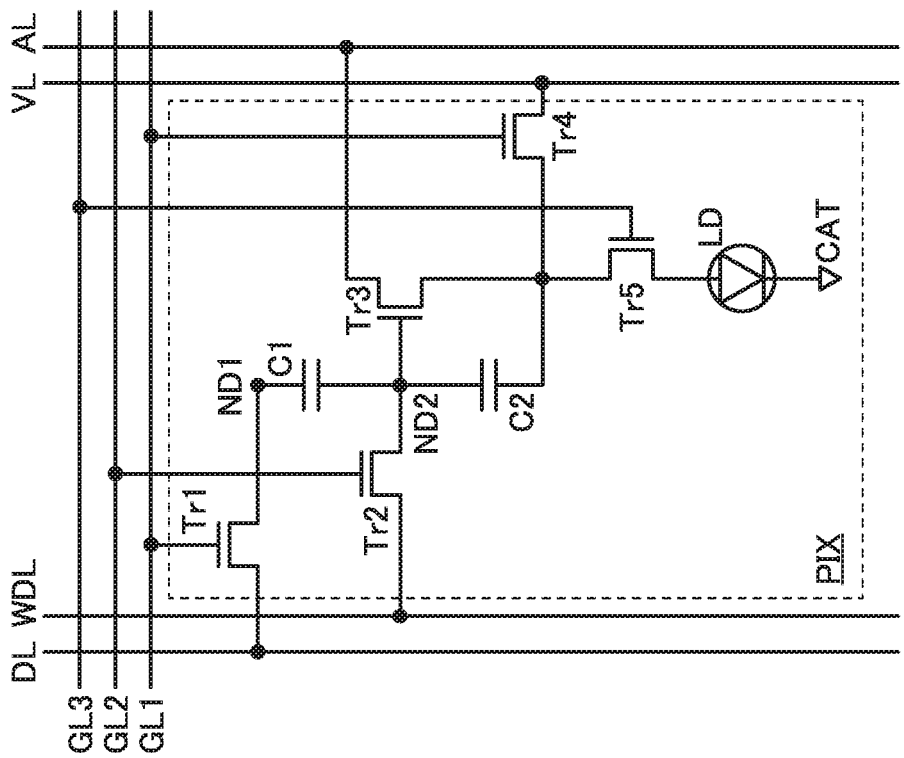

FIGS. 2A and 2B illustrate circuit configuration examples of the pixel PIX including a light-emitting element, which is a semiconductor device of one embodiment of the present invention.

The pixel PIX illustrated in FIG. 2A includes transistors Tr1 to Tr5, capacitors C1 and C2, and a light-emitting element LD. A wiring DL, a wiring WDL, wirings GL1 to GL3, a wiring VL, a wiring AL, and a wiring CAT are electrically connected to the pixel PIX.

The transistors Tr1, Tr2, Tr4, and Tr5 each function as a switching element. The transistor Tr3 functions as a driver transistor that controls a current flowing to the light-emitting element LD. For the transistors Tr1 to Tr5, the structures described in Embodiment 3 can be used.

Each of the wiring DL and the wiring WDL is for transmitting image data to the pixel PIX and corresponds to the wiring SL of the display device DD in FIG. 1. The wirings GL1 to GL3 are each a selection signal line for the pixel PIX and correspond to the wiring GL of the display device DD in FIG. 1.

The wiring VL is for supplying a predetermined potential to a specific node in the pixel PIX. The wiring AL is for supplying a current to be supplied to the light-emitting element LD.

The wiring CAT is for supplying a predetermined potential to an output terminal of the light-emitting element LD. The predetermined potential is, for example, a reference potential, a low-level potential, or a potential lower than these potentials.

A first terminal of the transistor Tr1 is electrically connected to a first terminal of the capacitor C1. A second terminal of the transistor Tr1 is electrically connected to the wiring DL. A gate of the transistor Tr1 is electrically connected to the wiring GL1. A first terminal of the transistor Tr2 is electrically connected to a gate of the transistor Tr3, a second terminal of the capacitor C1, and a first terminal of the capacitor C2. A second terminal of the transistor Tr2 is electrically connected to the wiring WDL. A gate of the transistor Tr2 is electrically connected to the wiring GL2.

Figure 3:
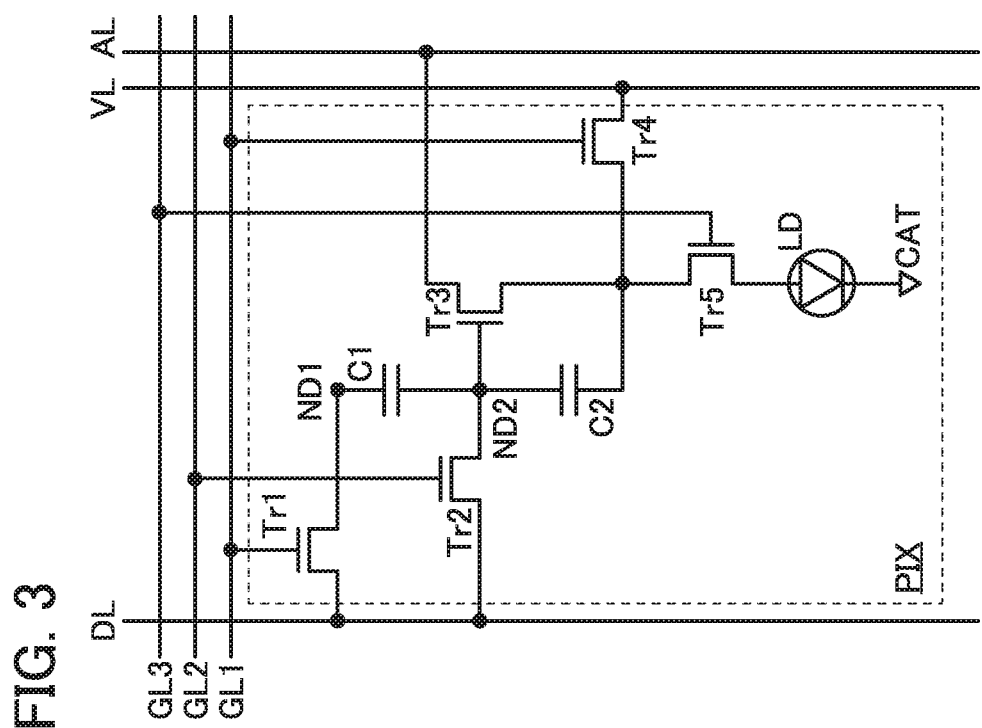
FIG. 3 is a circuit diagram illustrating an example of a pixel.

In FIG. 2A and FIG. 2B and FIG. 3 that are described later, an electrical connection point of the first terminal of the transistor Tr1 and the first terminal of the capacitor C1 is represented as a node ND1, and an electrical connection point of the first terminal of the transistor Tr2, the gate of the transistor Tr3, the second terminal of the capacitor C1, and the first terminal of the capacitor C2 is represented as a node ND2.

A first terminal of the transistor Tr3 is electrically connected to the wiring AL. A second terminal of the transistor Tr3 is electrically connected to a first terminal of the transistor Tr4, a first terminal of the transistor Tr5, and a second terminal of the capacitor C2. A second terminal of the transistor Tr4 is electrically connected to the wiring VL. A gate of the transistor Tr4 is electrically connected to the wiring GL1. The second terminal of the transistor Tr5 is electrically connected to an input terminal of the light-emitting element LD. A gate of the transistor Tr5 is electrically connected to the wiring GL3. The output terminal of the light-emitting element LD is electrically connected to the wiring CAT.

In the pixel PIX in FIG. 2A, the transistors Tr1, Tr2, and Tr5 are preferably OS transistors. In particular, the OS transistors each preferably include an oxide containing at least one of indium, an element M (the element M is aluminum, gallium, yttrium, or tin), and zinc in a channel formation region. The oxide will be described in detail in Embodiment 4. The use of such OS transistors as the transistors Tr1, Tr2, and Tr5 enables the off-state current of the transistors to be extremely low. When data is held at the first terminal of the capacitor C1 (the node ND1), the use of an OS transistor as the transistor Tr1 can prevent data held at the node ND1 from being corrupted by the off-state current. Similarly, when data is held at the gate of the transistor Tr3, the second terminal of the capacitor C1, and the first terminal of the capacitor C2 (at the node ND2), the use of an OS transistor as the transistor Tr2 can prevent data held at the node ND2 from being corrupted by the off-state current. When light emission of the light-emitting element LD is temporarily stopped, the use of an OS transistor as the transistor Tr5 can prevent light emission of the light-emitting element LD by the off-state current.

For the transistor Tr3 and/or the transistor Tr4, a transistor including silicon in a channel formation region (hereinafter the transistor is referred to as a Si transistor) can be used, for example. As silicon, hydrogenated amorphous silicon, microcrystalline silicon, polycrystalline silicon, or the like can be used, for example.

For the transistor Tr3 and/or the transistor Tr4, an OS transistor can be used. In particular, in the case where the transistors Tr1 to Tr5 are all OS transistors, the transistors can be formed at a time, resulting in a reduction in the number of manufacturing steps of the display portion PA in some cases. Thus, time needed to manufacture the display portion PA can be shortened, and the number of the display portions PA that are manufactured in a certain period can be increased.

Note that the configuration of the pixel PIX of one embodiment of the present invention and the configuration of the wirings electrically connected to the pixel PIX are not limited to those illustrated in FIG. 2A. Components of the pixel PIX and the wirings of one embodiment of the present invention can be appropriately varied according to the conditions such as design specifications and the purpose.

Specifically, at least one of the transistors Tr1 to Tr5 of the pixel PIX in FIG. 2A may be a transistor with a back gate. Supply of a potential to a back gate of a transistor can increase and decrease the threshold voltage of the transistor. Electrically connecting a gate and a back gate of a transistor can further increase the amount of source-drain current that flows when the transistor is on. FIG. 2B illustrates the configuration in which the transistors Tr1 to Tr5 of the pixel PIX in FIG. 2A are each a transistor with a back gate and a gate and a back gate of each of the transistors are electrically connected to each other.

In another specific example, one wiring may double as the wiring DL and the wiring WDL (see FIG. 3).

Operation Example 1

Next, an operation example of the pixel PIX in FIG. 2A will be described. Note that the wiring DL and the wiring WDL of the pixel PIX in FIG. 2A are assumed to be electrically connected to the source driver circuit SD in FIG. 1 so that image data can be transmitted to the pixel PIX.

FIG. 4 is a timing chart showing an operation example of the pixel PIX in FIG. 2A. The timing chart of FIG. 4 shows changes in the potentials of the wirings DL, WDL, VL, and GL1 to GL3 and the nodes ND1 and ND2 at around Time T1 to Time T8. In FIG. 4, "high" refers to a high-level potential, "low" refers to a low-level potential, and "$V_{GND}$" refers to a reference potential.

Note that $V_{GND}$ is assumed to be constantly applied to the wiring VL during Time T1 to Time T8 and around the time periods.

In this operation example, the transistors Tr1, Tr2, Tr4, and Tr5 are assumed to operate in a linear region unless otherwise specified. In other words, the gate voltage, the source voltage, and the drain voltage of each of the transistors Tr1, Tr2, Tr4, and Tr5 are assumed to be appropriately biased so that the transistors operate in the linear region.

Furthermore, in this operation example, the transistor Tr3 is assumed to operate in a saturation region unless otherwise specified. In other words, the gate voltage, the source voltage, and the drain voltage of the transistor Tr3 are assumed to be appropriately biased so that the transistor operates in the saturation region. Note that even when the operation of the transistor Tr3 deviates from an operation in an ideal saturation region, the gate voltage, the source voltage, and the drain voltage of the transistor Tr3 are regarded as being appropriately biased as long as the accuracy of output current is within a desired range.

Before Time T1

Before Time T1, a low-level potential is supplied to the wirings GL1 and GL2, and a high-level potential is supplied to the wiring GL3. When the wiring GL1 is at a low-level potential, a low-level potential is supplied to gates of the transistors Tr1 and Tr4; thus, the transistors Tr1 and Tr4 are off. That is, there is no electrical continuity between the wiring DL and the node ND1. Similarly, when the wiring GL2 is at a low-level potential, a low-level potential is supplied to the gate of the transistor Tr2; thus, the transistor Tr2 is off. That is, there is no electrical continuity between the wiring WDL and the node ND2. When the wiring GL3 is at a high-level potential, a high-level potential is supplied to the transistor Tr5; thus, the transistor Tr5 is on. That is, there is electrical continuity between the input terminal of the light-emitting element LD and the first terminal of the transistor Tr5.

When a difference between the potential of the node ND2 and the potential of a source of the transistor Tr3 (gate-source voltage) is greater than the threshold voltage of the transistor Tr3, the transistor Tr3 is on, and a current that flows between the source and a drain of the transistor Tr3 is determined in accordance with the gate-source voltage of the transistor Tr3. In the case where the second terminal of the transistor Tr3 is the source, the current flows from the wiring AL to the input terminal of the light-emitting element LD through the transistors Tr3 and Tr5. Consequently, the light-emitting element LD emits light. Note that in the timing chart of FIG. 4, the potential of the node ND2 at which the transistor Tr3 is off is denoted as $V_0$ (that is, a difference between $V_0$ and the potential of the source of the transistor Tr3 is less than the threshold voltage of the transistor Tr3; thus, the light-emitting element LD does not emit light).

To briefly describe this operation example, the potential of the node ND1 before Time T1 is also set to $V_0$.

Assume that before Time T1, image data is not transmitted from the source driver circuit SD to the pixel PIX and $V_{GND}$ is applied to the wirings DL and WDL.

Time T1

At Time T1, a low-level potential is supplied to the wiring GL3. Thus, during a period from Time T1 to Time T2, a low-level potential is supplied to the gate of the transistor Tr5, so that the transistor Tr5 is off. Consequently, a current does not flow to the input terminal of the light-emitting element LD regardless of whether the transistor Tr3 is on or off, so that the light-emitting element LD does not emit light.

Time T2

At Time T2, a high-level potential is supplied to the wiring GL1. Thus, during a period from Time T2 to Time T3, a high-level potential is supplied to the gates of the transistors Tr1 and Tr4, so that the transistors Tr1 and Tr4 are on.

When the transistor Tr1 is turned on, the wiring DL and the node ND1 become electrically continuous. Thus, the potential of the node ND1 becomes $V_{GND}$. When the transistor Tr4 is turned on, the wiring VL and the second terminal of the capacitor C2 become electrically continuous. Thus, the potential of the second terminal of the capacitor C2 becomes $V_{GND}$.

The second terminal of the capacitor C1 (the node ND2) is in a floating state; thus, when the potential of the node ND1 changes, the potential of the node ND2 also changes due to capacitive coupling. Note that the amount of change in the potential of the node ND2 depends on the amount of change in the potential of the node ND1, the capacitance of the capacitor C1, and the like. In this operation example, the potential of the node ND1 decreases from $V_0$ to $V_{GND}$; accordingly, the potential of the node ND2 decreases from $V_0$.

Time T3

At Time T3, a high-level potential is supplied to the wiring GL2. Thus, during a period from Time T3 to Time T4, a high-level potential is supplied to the gate of the transistor Tr2, so that the transistor Tr2 is on.

When the transistor Tr2 is turned on, the wiring WDL and the node ND2 become electrically continuous. Thus, the potential of the node ND2 becomes $V_{GND}$. Since the transistor Tr1 is on, the potential of the node ND1 is not changed by a change in the potential of the node ND2. Similarly, since the transistor Tr4 is on, the potential of the second terminal of the capacitor C2 is also not changed by a change in the potential of the node ND2.

Time T4

At Time T4, an analog signal is sent as image data from the source driver circuit SD to the wirings DL and WDL. Here, $V_{data}$ is input as the potential of the analog signal to the wirings DL and WDL.

Since the transistor Tr1 is on, $V_{data}$ is applied from the wiring DL to the first terminal of the capacitor C1 (the node ND1). The transistor Tr2 is also on; thus, $V_{data}$ is applied from the wiring WDL to the gate of the transistor Tr3, the second terminal of the capacitor C1, and the first terminal of the capacitor C2 (to the node ND2). Note that the potential of the second terminal of the capacitor C2 is not changed by changes in the potentials of the nodes ND1 and ND2 since the transistor Tr4 is on.

Time T5

At Time T5, a low-level potential is supplied to the wiring GL2. Thus, during a period from Time T5 to Time T6, a low-level potential is supplied to the gate of the transistor Tr2, so that the transistor Tr2 is off.

When the transistor Tr2 is turned off, the wiring WDL and the node ND2 become electrically discontinuous. Thus, the node ND2 is brought into a floating state.

Time T6

At Time T6, a signal that is obtained by adding the potential of $\Delta V_{data}$ to the potential $V_{data}$ input during a period from Time T4 to Time T6 is sent from the source driver circuit SD to the wirings DL and WDL. That is, the potentials of the wirings DL and WDL are $V_{data}+\Delta V_{data}$.

Since the transistor Tr1 is on, $V_{data}+\Delta V_{data}$ is applied from the wiring DL to the node ND1. That is, the potential of the node ND1 changes from $V_{data}$ during the period from Time T4 to Time T6 to $V_{data}+\Delta V_{data}$.

Since the transistor Tr2 is off, $V_{data}+\Delta V_{data}$ is not applied from the wiring WDL to the node ND2. However, the potential of the node ND1 changes from $V_{data}$ to $V_{data}+\Delta V_{data}$ and the node ND2 is in a floating state; thus, the change in the potential of the node ND1 causes a change in the potential of the node ND2 due to the capacitive coupling of the capacitor C1. In the timing chart of FIG. 4, the amount of change in the potential of the node ND2 is denoted as $\Delta V_g$, and $\Delta V_g$ can be estimated by Formula (E1) below.

[Formula 1]

$$\Delta V_g = \frac{C_1}{C_1+C_2} \Delta V_{data} \qquad (E1)$$

Therefore, when the potential of the node ND2 is $V_{ND2}$, the capacitance of the capacitor C1 is $C_1$, and the capacitance of the capacitor C2 is $C_2$, $V_{ND2}$ can be expressed by Formula (E2) below.

[Formula 2]

$$V_{ND2} = V_{data} + \frac{C_1}{C_1+C_2} \Delta V_{data} \qquad (E2)$$

Although the potential of the wiring WDL is $V_{data}+\Delta V_{data}$ at Time T6, $V_{data}+\Delta V_{data}$, the potential of the wiring WDL, is not input to any element in the circuit configuration example illustrated in FIG. 2A. For this reason, in the circuit configuration example in FIG. 2A, the potential of the wiring WDL does not have to be $V_{data}+\Delta V_{data}$ at Time T6.

Time T7

At Time T7, a low-level potential is supplied to the wiring GL1. Thus, a low-level potential is supplied to the gate of the transistor Tr1 during a period from Time T7 to Time T8, and the transistor Tr1 is off. Consequently, the node ND1 is in a floating state, and the potential of the node ND1 is held by the capacitor C1.

During the period from Time T7 to Time T8, a low-level potential is supplied to the gate of the transistor Tr4, so that the transistor Tr4 is off. At this time, the potential of the second terminal of the capacitor C2 is $V_{GND}$ and the potential of the gate of the transistor Tr3 (the node ND2) is $V_{ND2}$; thus, when $V_{ND2}-V_{GND}$ is higher than the threshold voltage of the transistor Tr3, the transistor Tr3 is on. A current that flows between the source and the drain of the transistor Tr3 depends on $V_{ND2}-V_{GND}$.

Time T8

At Time T8, a high-level potential is supplied to the wiring GL3. Thus, after Time T8, a high-level potential is supplied to the gate of the transistor Tr5, so that the transistor Tr5 is on.

Accordingly, a current flowing from the wiring AL is supplied to the input terminal of the light-emitting element LD through the transistors Tr3 and Tr5, whereby the light-emitting element LD emits light. At this time, a voltage is applied between the input terminal and the output terminal of the light-emitting element LD and a predetermined potential is supplied to the wiring CAT, so that the potential of an electrical connection point of the second terminal of the transistor Tr3, the first terminal of the transistor Tr4, the first terminal of the transistor Tr5, and the second terminal of the capacitor C2 increases. The nodes ND1 and ND2 are each in a floating state; thus, when the potential of the electrical connection point increases, the potentials of the nodes ND1 and ND2 are also increased by capacitive coupling in some cases. In the timing chart of FIG. 4, the potentials of the nodes ND1 and ND2 after Time T8 are higher than those during the period from Time T7 to Time T8.

Note that the luminance of the light-emitting element LD depends on a current flowing to the light-emitting element LD. According to Kirchhoff's law, the current flowing to the light-emitting element LD is substantially equal to a current flowing between the source and the drain of the transistor Tr3; thus, the luminance of the light-emitting element LD depends on the gate-source voltage of the transistor Tr3.

The operations of the pixel PIX in FIG. 2A at around Time T1 to Time T8 in the timing chart of FIG. 4 are performed in the aforementioned manner, whereby potentials can be supplied to the image data storage portion (the node ND2) of the pixel PIX in smaller steps than potentials that can be output from the D/A converter circuit DAC.

Pixel PIX Including Liquid Crystal Element

Figure 5A:
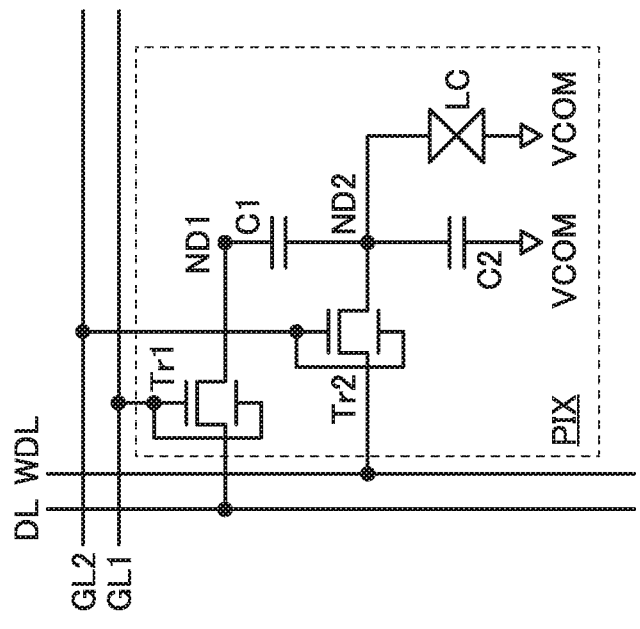
FIGS. 5A and 5B are circuit diagrams each showing an example of a pixel.
Figure 5B:
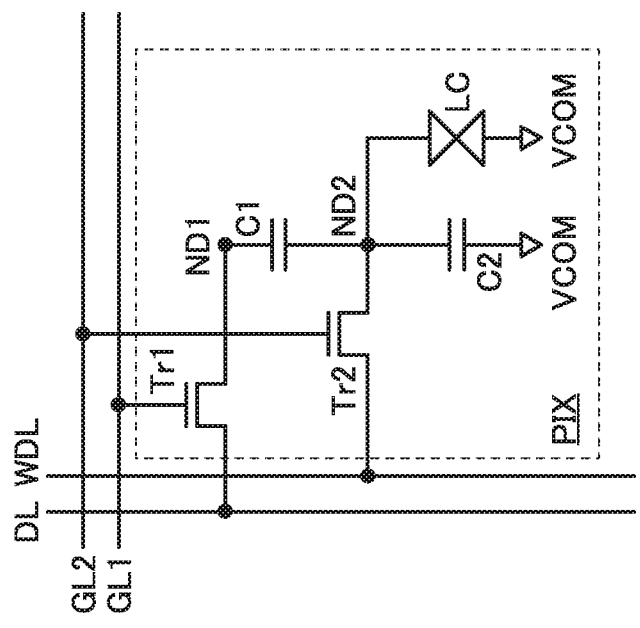

Here, FIGS. 5A and 5B illustrate circuit configuration examples of the pixel PIX including a liquid crystal element, which is a semiconductor device of one embodiment of the present invention.

The pixel PIX illustrated in FIG. 5A includes the transistors Tr1 and Tr2, the capacitors C1 and C2, and a liquid crystal element LC. The wirings DL, WDL, GL1, and GL2, and a wiring VCOM are electrically connected to the pixel PIX.

The transistors Tr1 and Tr2 each function as a switching element. In particular, the transistor Tr2 functions as a driver transistor that applies voltage to a first terminal of the liquid crystal element LC. The structures described in Embodiment 3 can be used for the transistors Tr1 and Tr2.

Each of the wiring DL and the wiring WDL is for transmitting image data to the pixel PIX and correspond to the wiring SL of the display device DD in FIG. 1. The wirings GL1 and GL2 are each a selection signal line for the pixel PIX and correspond to the wiring GL of the display device DD in FIG. 1.

The wiring VCOM is for supplying a predetermined potential to a second terminal of the liquid crystal element LC. The predetermined potential is, for example, a reference potential, a low-level potential, or a potential lower than these potentials. Furthermore, the wiring VCOM can supply a common potential to the second terminal of the liquid crystal element LC included in each of the pixels PIX of the display portion PA.

The first terminal of the transistor Tr1 is electrically connected to the first terminal of the capacitor C1. The second terminal of the transistor Tr1 is electrically connected to the wiring DL. The gate of the transistor Tr1 is electrically connected to the wiring GL1. The first terminal of the transistor Tr2 is electrically connected to the second terminal of the capacitor C1, the first terminal of the capacitor C2, and the first terminal of the liquid crystal element LC. The second terminal of the transistor Tr2 is electrically connected to the wiring WDL. The gate of the transistor Tr2 is electrically connected to the wiring GL2.

Figure 6:
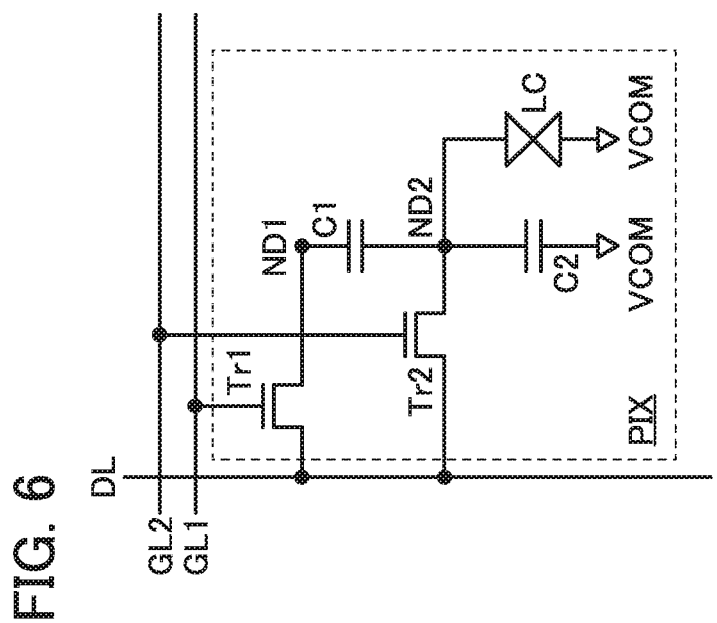
FIG. 6 is a circuit diagram illustrating an example of a pixel.

In FIG. 5A and FIG. 5B and FIG. 6 that are described later, an electrical connection point of the first terminal of the transistor Tr1 and the first terminal of the capacitor C1 is represented as the node ND1, and an electrical connection point of the first terminal of the transistor Tr2, the second terminal of the capacitor C1, the first terminal of the capacitor C2, and the first terminal of the liquid crystal element LC is represented as the node ND2.

The second terminal of the liquid crystal element LC is electrically connected to the wiring VCOM. The second terminal of the capacitor C2 is electrically connected to the wiring VCOM.

In the pixel PIX in FIG. 5A, the transistors Tr1 and Tr2 are preferably OS transistors. In particular, OS transistors preferably include an oxide containing at least one of indium, an element M (the element M is aluminum, gallium, yttrium, or tin), and zinc in a channel formation region. The oxide will be described in detail in Embodiment 4. The use of such OS transistors as the transistors Tr1 and Tr2 enables the off-state current of the transistors to be extremely low. When data is held at the first terminal of the capacitor C1 (the node ND1), the use of an OS transistor as the transistor Tr1 can prevent data held at the node ND1 from being corrupted by the off-state current. Similarly, when data is held at the second terminal of the capacitor C1, the first terminal of the capacitor C2, and the first terminal of the liquid crystal element LC (at the node ND2), the use of an OS transistor as the transistor Tr2 can prevent data held at the node ND2 from being corrupted by the off-state current.

For the transistor Tr1 and/or the transistor Tr2, the Si transistor described above can be used, for example.

The channel formation regions of the transistors Tr1 and Tr2 are preferably formed using the same material. For example, in the case where the transistors Tr1 and Tr2 are each an OS transistor, the transistors can be formed at a time, resulting in a reduction in the number of manufacturing steps of the display portion PA in some cases. Thus, time needed to manufacture the display portion PA can be shortened, and the number of the display portions PA that are manufactured in a certain period can be increased.

Operation Example 2

Next, an operation example of the pixel PIX in FIG. 5A will be described. Note that the wiring DL and the wiring WDL of the pixel PIX in FIG. 5A are assumed to be electrically connected to the source driver circuit SD in FIG. 1 so that image data can be transmitted to the pixel PIX.

FIG. 7 is a timing chart showing an operation example of the pixel PIX in FIG. 5A. The timing chart of FIG. 7 shows changes in the potentials of the wirings DL, WDL, VCOM, GL1, and GL2 and the nodes ND1 and ND2 at around Time T1 to Time T6. In FIG. 7, "high" refers to a high-level potential, "low" refers to a low-level potential, and "$V_{GND}$" refers to a reference potential.

Note that $V_{GND}$ is assumed to be constantly applied to the wiring VCOM during Time T1 to Time T6 and around the time periods.

In this operation example, the transistors Tr1 and Tr2 are assumed to operate in a linear region unless otherwise specified. In other words, the gate voltage, the source voltage, and the drain voltage of each of the transistors Tr1 and Tr2 are assumed to be appropriately biased so that the transistors operate in the linear region.

Note that the configuration of the pixel PIX of one embodiment of the present invention and the configuration of the wirings electrically connected to the pixel PIX are not limited to those illustrated in FIG. 5A. Components of the pixel PIX and the wirings of one embodiment of the present invention can be appropriately varied according to the conditions such as design specifications and the purpose.

Specifically, at least one of the transistors Tr1 and Tr2 of the pixel PIX in FIG. 5A may be a transistor with a back gate. Supply of a potential to a back gate of a transistor can increase and decrease the threshold voltage of the transistor.

Electrically connecting a gate and a back gate of a transistor can further increase the amount of source-drain current that flows when the transistor is on. FIG. 5B illustrates the configuration in which the transistors Tr1 and Tr2 of the pixel PIX in FIG. 5A are each a transistor with a back gate and a gate and a back gate of each of the transistors are electrically connected to each other.

In another specific example, one wiring may double as the wiring DL and the wiring WDL (see FIG. 6). Note that the above operation example is referred to for an operation method of the pixel PIX in FIG. 6.

Before Time T1

Before Time T1, a low-level potential is supplied to the wirings GL1 and GL2. When the wiring GL1 is at a low-level potential, a low-level potential is supplied to the gate of the transistor Tr1; thus, the transistor Tr1 is off. That is, there is no electrical continuity between the wiring DL and the node ND1. Similarly, when the wiring GL2 is at a low-level potential, a low-level potential is supplied to the gate of the transistor Tr2; thus, the transistor Tr2 is off. That is, there is no electrical continuity between the wiring WDL and the node ND2.

When a potential difference greater than or equal to a predetermined value is caused between the first terminal (the node ND2) and the second terminal of the liquid crystal element LC, liquid crystal molecules contained in the liquid crystal element LC are oriented in accordance with the potential difference. The oriented liquid crystal molecules transmit light from a backlight unit included in the display device DD, whereby the light is emitted from the pixel PIX. The intensity of the light depends on a voltage applied between the first terminal (the node ND2) and the second terminal of the liquid crystal element LC, that is, the potential of the node ND2; thus, the potential is adjusted so that a gray-scale image can be displayed. Before Time T1 in the timing chart of FIG. 7, there is a potential difference between the first terminal (the node ND2) and the second terminal of the liquid crystal element LC that is not great enough to allow light emission from the pixel PIX, and such a potential is denoted as $V_0$. That is, in the timing chart of FIG. 7, $V_0$ is shown as the potential of the node ND2. Note that $V_0$ may be equal to $V_{GND}$ or a potential lower than $V_{GND}$. In this operation example, description will be made assuming that $V_0$ is a potential higher than $V_{GND}$ but not high enough to allow light emission from the pixel PIX.

To briefly describe this operation example, the potential of the node ND1 before Time T1 is also set to $V_0$.

Assume that before Time T1, image data is not transmitted from the source driver circuit SD to the pixel PIX and $V_{GND}$ is applied to the wirings DL and WDL.

Time T1

At Time T1, a high-level potential is supplied to the wiring GL1. Thus, during a period from Time T1 to Time T2, a high-level potential is supplied to the gate of the transistor Tr1, so that the transistor Tr1 is on.

When the transistor Tr1 is turned on, the wiring DL and the node ND1 become electrically continuous. Thus, the potential of the node ND1 becomes $V_{GND}$.

The second terminal of the capacitor C1 (the node ND2) is in a floating state; thus, when the potential of the node ND1 changes, the potential of the node ND2 also changes due to capacitive coupling. Note that the amount of change in the potential of the node ND2 depends on the amount of change in the potential of the node ND1, the capacitance of the capacitor C1, and the like. In this operation example, the potential of the node ND1 decreases from $V_0$ to $V_{GND}$; accordingly, the potential of the node ND2 decreases from $V_0$.

Time T2

At Time T2, a high-level potential is supplied to the wiring GL2. Thus, during a period from Time T2 to Time T3, a high-level potential is supplied to the gate of the transistor Tr2, so that the transistor Tr2 is on.

When the transistor Tr2 is turned on, the wiring WDL and the node ND2 become electrically continuous. Thus, the potential of the node ND2 becomes $V_{GND}$. Since the transistor Tr1 is on, the potential of the node ND1 is not changed by a change in the potential of the node ND2.

Time T3

At Time T3, an analog signal is sent as image data from the source driver circuit SD to the wirings DL and WDL. Here, $V_{data}$ is input as the potential of the analog signal to the wirings DL and WDL.

Since the transistor Tr1 is on, $V_{data}$ is applied from the wiring DL to the first terminal of the capacitor C1 (the node ND1). The transistor Tr2 is also on; thus, $V_{data}$ is applied from the wiring WDL to the second terminal of the capacitor C1, the first terminal of the capacitor C2 (the node ND2), and the first terminal of the liquid crystal element LC.

Time T4

At Time T4, a low-level potential is supplied to the wiring GL2. Thus, during a period from Time T4 to Time T5, a low-level potential is supplied to the gate of the transistor Tr2, so that the transistor Tr2 is off.

When the transistor Tr2 is turned off, the wiring WDL and the node ND2 become electrically discontinuous. Thus, the node ND2 is brought into a floating state.

Time T5

At Time T5, a signal that is obtained by adding the potential of $\Delta V_{data}$ to the potential $V_{data}$ input during a period from Time T3 to Time T5 is sent from the source driver circuit SD to the wirings DL and WDL. That is, the potentials of the wirings DL and WDL are $V_{data}+\Delta V_{data}$.

Since the transistor Tr1 is on, $V_{data}+\Delta V_{data}$ is applied from the wiring DL to the node ND1. That is, the potential of the node ND1 changes from $V_{data}$ during the period from Time T3 to Time T5 to $V_{data}+\Delta V_{data}$.

Since the transistor Tr2 is off, $V_{data}+\Delta V_{data}$ is not applied from the wiring WDL to the node ND2. However, the potential of the node ND1 changes from $V_{data}$ to $V_{data}+\Delta V_{data}$ and the node ND2 is in a floating state; thus, the change in the potential of the node ND1 causes a change in the potential of the node ND2 due to the capacitive coupling of the capacitor C1. In the timing chart of FIG. 7, the amount of change in the potential of the node ND2 is denoted as $\Delta V_g$, and $\Delta V_g$ can be estimated by Formula (E1) as in the operation example 1 when the capacitance of the capacitor C1 is $C_1$ and the capacitance of the capacitor C2 is $C_2$.

Therefore, when the potential of the node ND2 is $V_{ND2}$, $V_{ND2}$ can be expressed by Formula (E2) as in the operation example 1.

Note that in this operation example, parasitic capacitance caused between the first terminal and the second terminal of the liquid crystal element LC is ignored in Formulas (E1) and (E2). However, the first terminal of the liquid crystal element LC and the first terminal of the capacitor C2 are electrically connected to each other and the second terminal of the liquid crystal element LC and the second terminal of the capacitor C2 are electrically connected to the wiring VCOM, the liquid crystal element LC and the capacitor C2 can be regarded as being electrically connected in parallel. Therefore, the capacitance C2 in Formulas (E1) and (E2) can be seen as a value determined in consideration of the parasitic capacitance of the liquid crystal element.

Although the potential of the wiring WDL is $V_{data}+\Delta V_{data}$ during a period from Time T5 to Time T6, $V_{data}+\Delta V_{data}$, the potential of the wiring WDL, is not input to any element in the circuit configuration example illustrated in FIG. 5A. For this reason, in the circuit configuration example in FIG. 5A, the potential of the wiring WDL does not have to be $V_{data}+\Delta V_{data}$ at Time T6.

Time T6

At Time T6, a low-level potential is supplied to the wiring GL1. Thus, a low-level potential is supplied to the gate of the transistor Tr1 after Time T6, and the transistor Tr1 is off. Consequently, the node ND1 is in a floating state, and the potential of the node ND1 is held by the capacitor C1.

Here, the liquid crystal element LC after Time T5 will be described. A voltage of $V_{ND2}=V_{data}+\Delta V_g$ is applied between the first terminal and the second terminal of the liquid crystal element LC. Thus, after Time T5, liquid crystal molecules contained in the liquid crystal element LC are oriented in accordance with the potential $V_{ND2}$, and light is emitted from the pixel PIX.

Note that the luminance of light emitted from the pixel PIX depends on a voltage applied between the first terminal and the second terminal of the liquid crystal element LC.

The operations of the pixel PIX in FIG. 5A at around Time T1 to Time T6 in the timing chart of FIG. 7 are performed in the aforementioned manner, whereby potentials can be supplied to an image data storage portion (the node ND2) of the pixel PIX in smaller steps than potentials that can be output from the D/A converter circuit DAC.

Specific Example

Here, described will be an example of displaying image data with a larger number of gray levels than that of image data output from the D/A converter circuit DAC on the display portion PA of the display device DD according to the operation example 1 (or the operation example 2) described above.

In this example, a 6-bit D/A converter circuit is provided as the D/A converter circuit DAC of the source driver circuit SD, and the capacitance ratio of the capacitor C1 to the capacitor C2 ($C_1:C_2$) of the pixel PIX is set to 1:15.

The use of a 6-bit D/A converter circuit DAC as the D/A converter circuit DAC allows $V_{data}$ that is written to the nodes ND1 and ND2 of the pixel PIX to have any of the binary values from "000000" to "111111". Note that when the voltage value of "111111" is 6.3 V, the D/A converter circuit DAC can output $V_{data}$ in the range of 0 V to 6.3 V in 0.1 V steps.

Therefore, during the period from Time T4 to Time T5 in the operation example 1 described above (or during the period from Time T3 to Time T4 in the operation example 2 described above), $V_{data}$ in the range of 0 V to 6.3 V can be written to the nodes ND1 and ND2 of the pixel PIX.

When $V_{data}$ is a Value in the Range of 0 V to 4.8 V

First, the case will be described in which $V_{data}$ in the range of 0 V to 4.8 V (in the range of "000000" to "110000" in binary representation) is written to the nodes ND1 and ND2 of the pixel PIX.

The capacitance ratio of the capacitor C1 to the capacitor C2 ($C_1:C_2$) is 1:15; thus, Formula (E3) below is derived from Formula (E1) and the ratio $C_1:C_2=1:15$.

[Formula 3]

$$\Delta V_g = \frac{1}{16}\Delta V_{data} = \frac{1}{2^4}\Delta V_{data} \qquad (E3)$$

Here, $\Delta V_{data}$ is assumed to have any of the binary values from "000000" to "001111". In this case, the voltage value of $\Delta V_{data}$ is in the range of 0 V to 1.5 V in 0.1 V steps. That is, from Formula (E3), $\Delta V_g$ can be a value in the range of 0 V to 0.09375 V in 0.00625 V steps.

Thus, during the period from Time T6 to Time T7 in the operation example 1 (or during the period from Time T5 to Time T6 in the operation example 2), the potential of the node ND2 of the pixel PIX can be a value in the range of 0 V to 4.8+0.09375 V in 0.00625 V steps from Formulas (E2) and (E3).

When $V_{data}$ is a Value in the Range of 4.9 V to 6.3 V

Next, the case will be described in which $V_{data}$ in the range of 4.9 V to 6.3 V (in the range of "110001" to "111111" in binary representation) is written to the nodes ND1 and ND2 of the pixel PIX.

The capacitance ratio of the capacitor C1 to the capacitor C2 is the same as that when $V_{data}$ is a value in the range of 0 V to 4.8 V; thus, Formula (E3) can also be used in this case.

Here, $\Delta V_{data}$ is assumed to be a voltage in the range of −1.5 V to 0 V in 0.1 V steps, for example. That is, $\Delta V_{data}$ is assumed to be a negative value and $V_{data}+\Delta V_{data}$ is assumed to be a value in the range of 3.4 V to 6.3 V (in the range of "100010" to "111111" in binary representation).

In this case, from Formula (E3), $\Delta V_g$ can be a value in the range of −0.09375 V to 0 V in 0.00625 V steps.

Thus, during the period from Time T6 to Time T7 in the operation example 1 (or during the period from Time T5 to Time T6 in the operation example 2), the potential of the node ND2 of the pixel PIX can be a value in the range of 4.9-0.09375 V to 6.3 V in 0.00625 V steps from Formulas (E2) and (E3).

The above specific example is summarized as follows. When a D/A converter circuit (6-bit) capable of outputting an analog value in the range of 0 V to 6.3 V in 0.1 V steps is provided as the D/A converter circuit DAC and the capacitance ratio of the capacitor C1 to the capacitor C2 of the pixel PIX ($C_1$:$C_2$) is set to 1:15, a potential in the range of 0 V to 6.3 V can be supplied in 0.00625 V steps to the node ND2.

That is to say, the above operation example is performed in the pixel PIX in FIG. 2A or FIG. 5A, whereby voltages can be applied to the node ND2 in smaller steps than voltages a 6-bit D/A converter circuit DAC can output. In the above specific example, the D/A converter circuit DAC outputs potentials in 0.1 V steps; however, potentials can be written to the node ND2 of the pixel PIX in 0.00625 V steps. In other words, potentials (image data) can be written to the pixel PIX in smaller steps than potentials that can be output from the 6-bit D/A converter circuit DAC.

In the above specific example, $V_{data}$ that is applied by the 6-bit D/A converter circuit DAC corresponds to higher 6 bits of image data, and $\Delta V_g$ that is applied to the node ND2 by capacitive coupling of the pixel PIX corresponds to lower 4 bits of image data. That is, the pixel PIX in FIG. 2A or FIG. 5A can complement lower 4 bits of image data to higher 6 bits of image data supplied from the D/A converter circuit DAC.

An operation method of a semiconductor device or a display device of one embodiment of the present invention is not limited to the above operation example or specific example. In the operation method, the order of applying a potential to an element, a circuit, a wiring, or the like and the potential value can be changed as appropriate, for example. Since the configuration of the semiconductor device or the display device of one embodiment of the present invention can be changed as appropriate as described above, the operation method of the semiconductor device or the display device may be changed in accordance with the configuration.

Note that this embodiment can be combined with any of the other embodiments in this specification as appropriate.

Embodiment 2

In this embodiment, structure examples of a display device including an EL element and a display device including a liquid crystal element will be described. Note that the operation for adding lower bits of image data to image data output from the source driver circuit SD that is described in Embodiment 1 and the function of the operation will not be described in this embodiment.

Figure 8A:
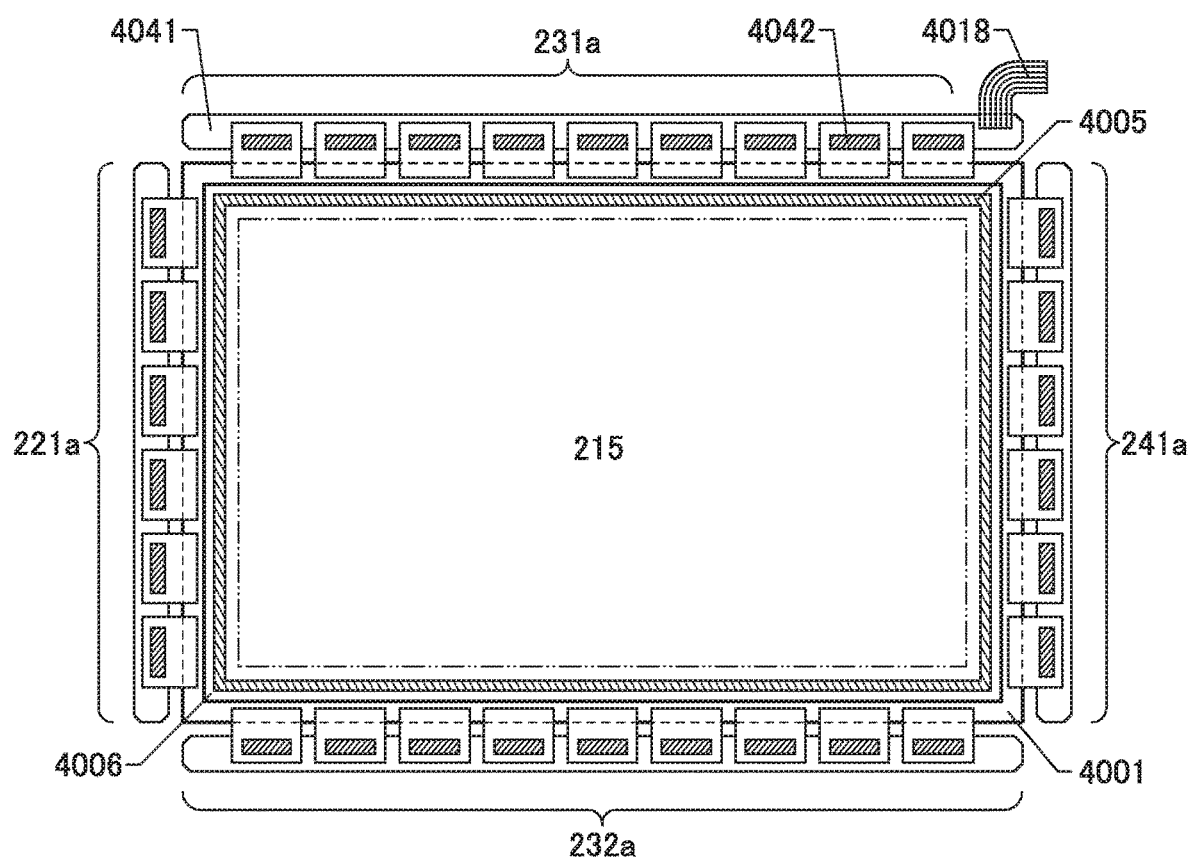
FIGS. 8A and 8B are top views each illustrating an example of a display device.

A display device illustrated in FIG. 8A includes a first substrate 4001 and a second substrate 4006. In the display device, a sealant 4005 is provided to surround a display portion 215 provided over the first substrate 4001, and the display portion 215 is sealed with the first substrate 4001, the sealant 4005, and the second substrate 4006.

A pixel array including the pixels PIX described in Embodiment 1 is provided in the display portion 215.

In FIG. 8A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a each function as the source driver circuit SD described in Embodiment 1. The scan line driver circuit 221a functions as the gate driver circuit GD described in Embodiment 1. The common line driver circuit 241a has a function of supplying a predetermined potential to the wiring CAT or the wiring VCOM described in Embodiment 1.

Signals and potentials are supplied to the scan line driver circuit 221a, the common line driver circuit 241a, the signal line driver circuit 231a, and the signal line driver circuit 232a through a flexible printed circuit (FPC) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying an image signal to the display portion 215. The integrated circuits 4042 are mounted in a region different from a region surrounded by the sealant 4005 over the first substrate 4001.

Note that the connection method of the integrated circuits 4042 is not particularly limited; a wire bonding method, a chip on glass (COG) method, a tape carrier package (TCP) method, a chip on film (COF) method, or the like can be used.

Figure 8B:
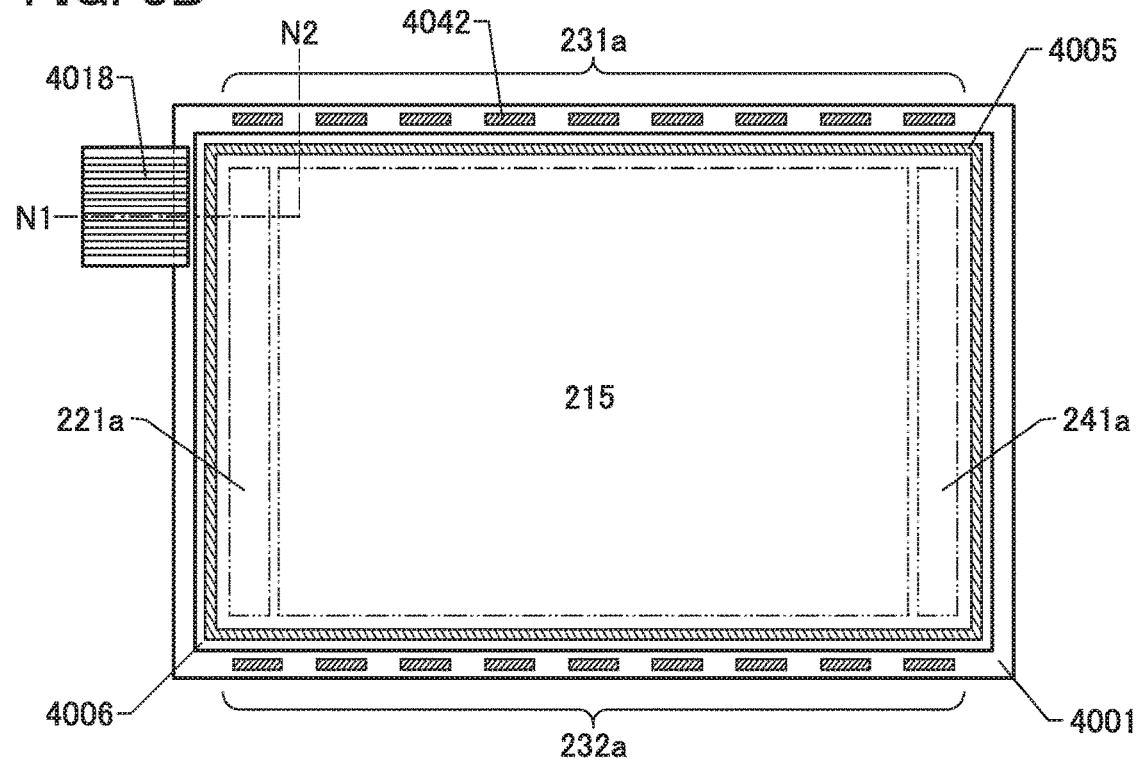

FIG. 8B shows an example of mounting the integrated circuits 4042 included in the signal line driver circuit 231a and the signal line driver circuit 232a by a COG method. Some or all of the driver circuits can be formed over the substrate 4001 over which the display portion 215 is formed, whereby a system-on-panel can be obtained.

In the example shown in FIG. 8B, the scan line driver circuit 221a and the common line driver circuit 241a are formed over the substrate over which the display portion 215 is formed. When the driver circuits are formed concurrently with a pixel circuit in the display portion 215, the number of components can be reduced. Accordingly, the productivity can be increased.

In FIG. 8B, the sealant 4005 is provided to surround the display portion 215, the scan line driver circuit 221a, and the common line driver circuit 241a over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element with the use of the first substrate 4001, the sealant 4005, and the second substrate 4006.

Although the signal line driver circuit 231a and the signal line driver circuit 232a are formed separately and mounted on the first substrate 4001 in the example shown in FIG. 8B, one embodiment of the present invention is not limited to this structure. The scan line driver circuit may be separately formed and then mounted, or part of the signal line driver circuits or part of the scan line driver circuit may be separately formed and then mounted.

In some cases, the display device encompasses a panel in which a display element is sealed, and a module in which an IC or the like including a controller is mounted on the panel.

The display portion and the scan line driver circuit over the first substrate each include a plurality of transistors. An OS transistor or a Si transistor can be used as the transistors.

Transistors included in the peripheral driver circuits and transistors included in the pixel circuit of the display portion may have the same structure or different structures. The transistors included in the peripheral driver circuits may have the same structure, or a combination of two or more kinds of structures may be used for the transistors. Similarly, the transistor included in the pixel circuit may have the same structure, or a combination of two or more kinds of structures may be used for the transistors.

An input device 4200 can be provided over the second substrate 4006. The display devices illustrated in FIGS. 8A and 8B and provided with the input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on either one or both of a substrate supporting a display element and a counter substrate.

Figure 9A:
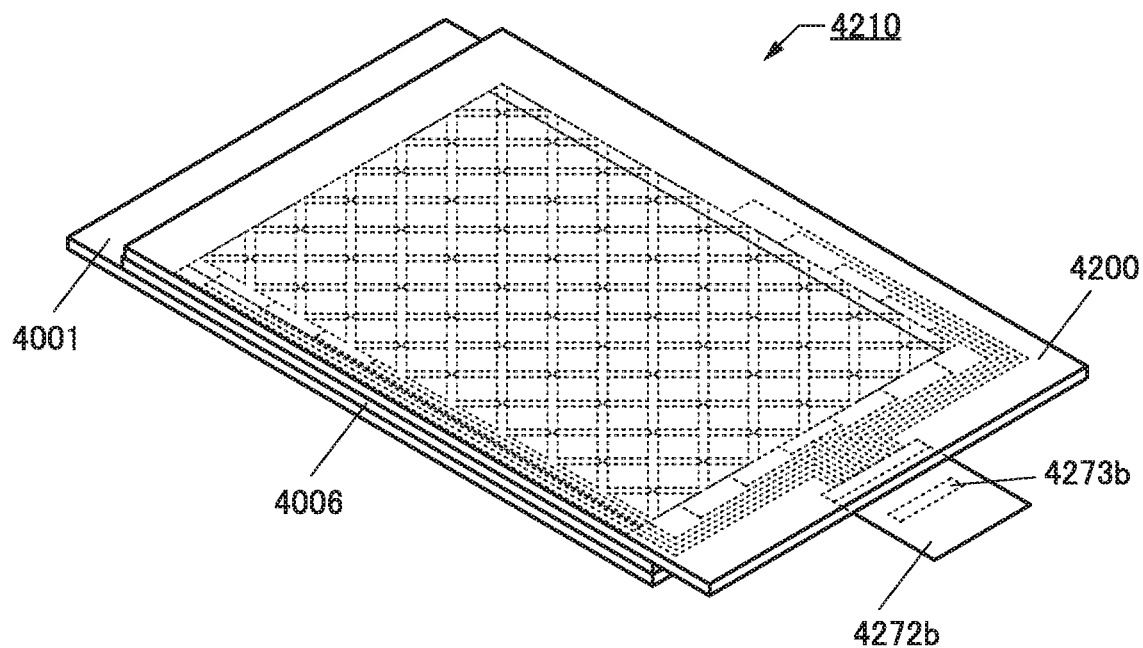
FIGS. 9A and 9B are perspective views each illustrating an example of a touch panel.
Figure 9B:
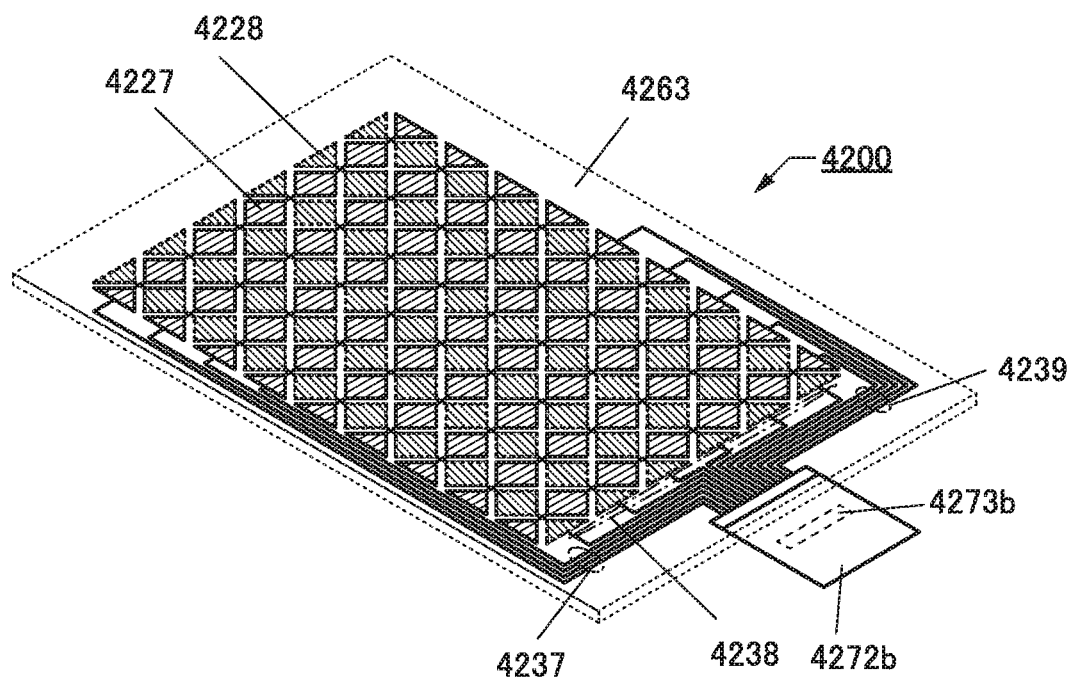

FIGS. 9A and 9B illustrate an example of the touch panel. FIG. 9A is a perspective view of a touch panel 4210. FIG. 9B is a schematic perspective view of the input device 4200. Note that for simplicity, FIGS. 9A and 9B illustrate only the major components.

The touch panel 4210 has a structure in which a display device and a sensor element that are formed separately are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or 4239. In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

A touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

Figure 10:
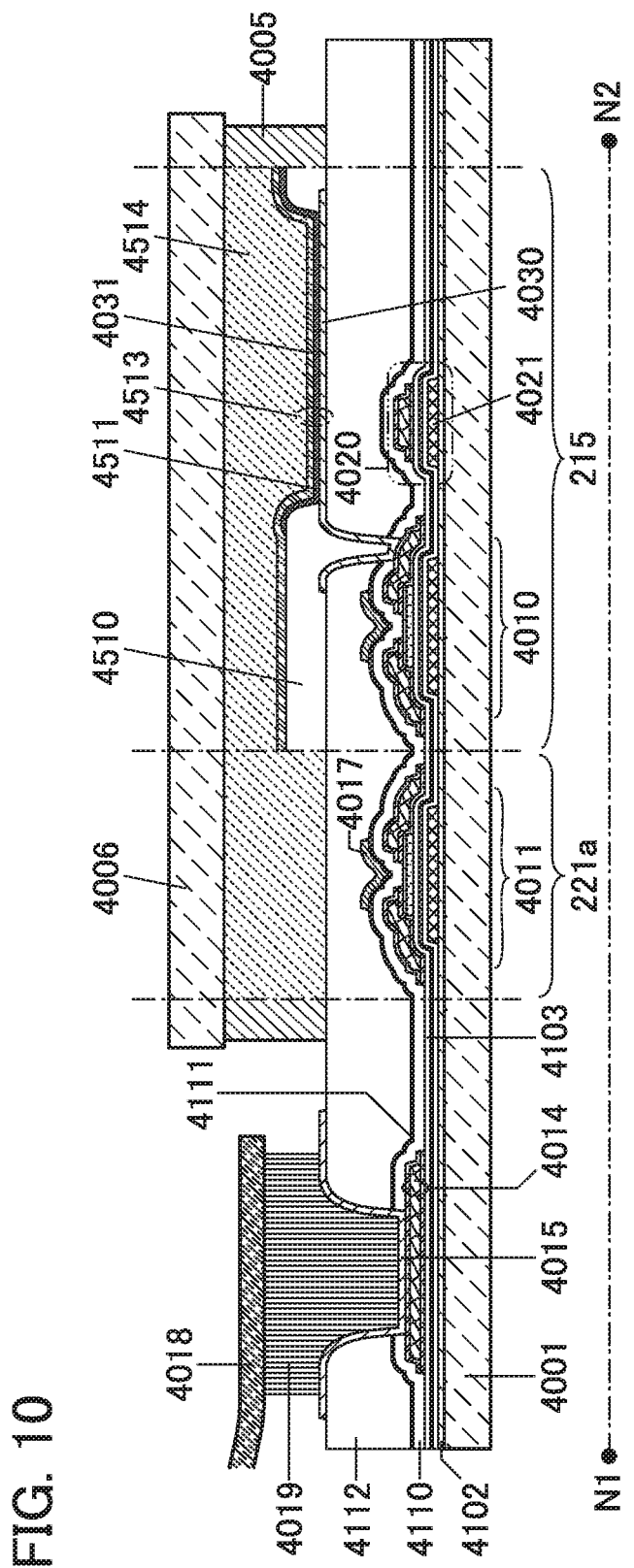
FIG. 10 is a cross-sectional view illustrating an example of a display device.

FIG. 10 is a cross-sectional view taken along the dashed-dotted line N1-N2 in FIG. 8B in the case of a light-emitting display device in which a light-emitting element is used as the display element of the display device illustrated in FIG. 8B (such a display device is also referred to as an "EL display device"). In addition, FIG. 11 is a cross-sectional view taken along the dashed-dotted line N1-N2 in FIG. 8B in the case where a display device including a liquid crystal element is used as the display device illustrated in FIG. 8B.

Note that as for the description of the display devices in FIG. 10 and FIG. 11, unless otherwise specified, the structure common to both of the display devices will be described first, and then, differences between the structures of the display devices in FIG. 10 and FIG. 11 will be described.

Figure 11:
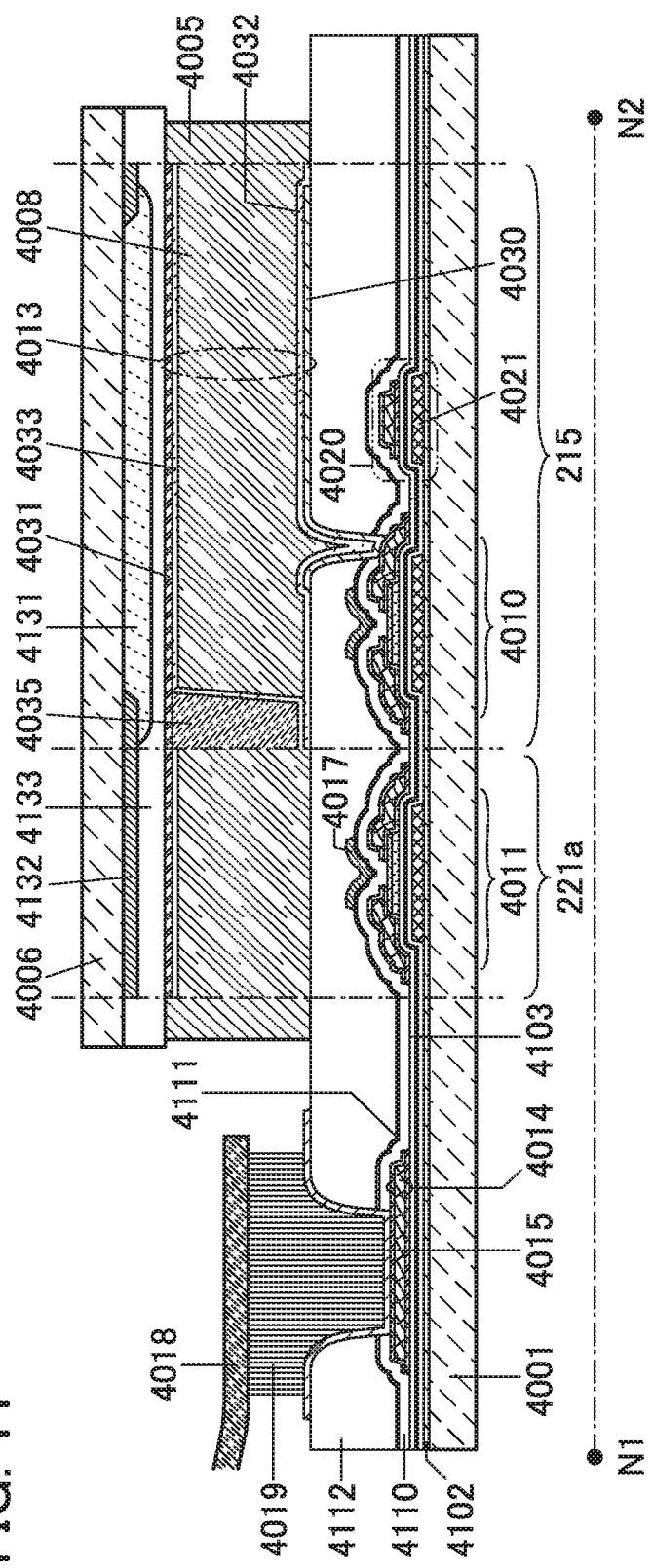
FIG. 11 is a cross-sectional view illustrating an example of a display device.

The display devices illustrated in FIG. 10 and FIG. 11 each include an electrode 4015, which is electrically connected to a terminal of the FPC 4018 through an anisotropic conductive layer 4019. In FIG. 10 and FIG. 11, the electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as source electrodes and drain electrodes of transistors 4010 and 4011.

The display portion 215 and the scan line driver circuit 221a provided over the first substrate 4001 each include a plurality of transistors. In FIG. 10 and FIG. 11, the transistor 4010 included in the display portion 215 and the transistor 4011 included in the scan line driver circuit 221a are shown as an example. In the examples shown in FIG. 10 and FIG. 11, the transistors 4010 and 4011 are bottom-gate transistors but may be top-gate transistors. The transistor 4011 may be included in the gate driver circuit GD described in Embodiment 1.

In FIG. 10 and FIG. 11, the insulating layer 4112 is provided over the transistors 4010 and 4011. A bank 4510 is provided over the insulating layer 4112 in the display device illustrated in FIG. 10.

The transistors 4010 and 4011 are provided over an insulating layer 4102 in FIG. 10 and FIG. 11. The transistors 4010 and 4011 each include an electrode 4017 formed over the insulating layer 4111. The electrode 4017 can serve as a back gate electrode.

The display devices illustrated in FIG. 10 and FIG. 11 each include a capacitor 4020. The capacitor 4020 includes an electrode 4021 formed in the same step as a gate electrode of the transistor 4010, and an electrode formed in the same step as a source electrode and a drain electrode of the transistor 4010. The electrodes overlap with each other with the insulating layer 4103 therebetween. Note that the capacitor 4020 can be the capacitor C1 or the capacitor C2 of the pixel PIX described in Embodiment 1, for example.

In general, the capacitance of a capacitor provided in a pixel portion of a display device is set in consideration of the leakage current or the like of transistors in the pixel portion so that charges can be held for a predetermined period. The capacitance of the capacitor may be set considering the off-state current of the transistor, or the like.

The transistor 4010 included in the display portion 215 is electrically connected to the display element.

The display devices illustrated in FIG. 10 and FIG. 11 each include the insulating layers 4111 and 4102. As the insulating layers 4111 and 4102, insulating layers through which an impurity element does not easily pass are used. The transistors are sandwiched between the insulating layers 4111 and 4102, whereby entry of impurities into semiconductor layers from the outside can be prevented.

Here, an organic EL element included in the display device in FIG. 10 will be described in detail. The EL element is a light-emitting element utilizing electroluminescence and includes a layer containing a light-emitting compound (such a layer is also referred to as an "EL layer"), between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode into the EL layer and holes are injected from the other electrode into the EL layer. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

In addition to the light-emitting compound, the EL layer may further include any of a substance with an excellent hole-injection property, a substance with an excellent hole-transport property, a hole-blocking material, a substance with an excellent electron-transport property, a substance with an excellent electron-injection property, a substance with a bipolar property (a substance with an excellent electron- and hole-transport property), and the like.

The EL layer can be formed by an evaporation method (including a vacuum evaporation method), a transfer method, a printing method, an inkjet method, a coating method, or the like.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions. Here, the case will be described in which an organic EL element is used as a light-emitting element.

In order to extract light emitted from the light-emitting element, at least one of a pair of electrodes needs to be transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

Here, the display device in FIG. 10 using a light-emitting element as a display element will be described. A light-emitting element 4513 which is a display element is electrically connected to the transistor 4010 provided in the display portion 215. That is, the transistor 4010 and the light-emitting element 4513 correspond to the transistor Tr5 and the light-emitting element LD which are described in Embodiment 1, respectively. The structure of the light-emitting element 4513 is the layered structure of the first electrode layer 4030, a light-emitting layer 4511, and a second electrode layer 4031, but is not limited to this structure. The structure of the light-emitting element 4513 can be changed as appropriate depending on the direction in which light is extracted from the light-emitting element 4513, for example.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 whose emission color is white is combined with a coloring layer and a method in which the light-emitting element 4513 with a different emission color is provided in each pixel. The former method is more productive than the latter method. The latter method, which requires separate formation of the light-emitting layer 4511 pixel by pixel, is less productive than the former method; however, the latter method can produce the emission color with higher color purity than that of the emission color produced by the former method. When the light-emitting element 4513 has a microcavity structure in the latter method, the color purity can be further increased.

The light-emitting layer 4511 may contain an inorganic compound such as quantum dots. For example, when used for the light-emitting layer, the quantum dots can serve as a light-emitting material.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In a space which is formed with the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification so that the light-emitting element is not exposed to the outside air, in this manner.

As well as an inert gas such as nitrogen or argon, an ultraviolet curable resin or a thermosetting resin can be used as the filler 4514; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit or a resin material such as a resin that is curable at room temperature (e.g., a two-component-mixture-type resin), a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer for applying voltage to the display element each have a light-transmitting property or a light-reflecting property, which depends on the direction in which light is extracted, the position where the electrode layer is provided, and the pattern structure of the electrode layer. Note that each of the first electrode layer and the second electrode layer is also referred to as a pixel electrode layer, a common electrode layer, a counter electrode layer, or the like.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Next, the display device in FIG. 11 using a transmissive liquid crystal element as a display element (also referred to as a "liquid crystal display device") will be described. In FIG. 11, a liquid crystal element 4013 which is a display element includes the first electrode layer 4030, the second electrode layer 4031, and a liquid crystal layer 4008. Insulating layers 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween. The transistor 4010 included in the display portion 215 is electrically connected to the liquid crystal element 4013. That is, the transistor 4010 and the liquid crystal element 4013 can be the transistor Tr2 and the liquid crystal element LC of the pixel PIX that are described in Embodiment 1, respectively, for example.

It is preferable to use a conductive material which transmits visible light for the first electrode layer 4030 and the second electrode layer 4031. As the conductive material, for example, a material containing one or more kinds selected from indium (In), zinc (Zn), and tin (Sn) can be used. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium can be given, for example. Note that a film containing graphene can be used. The film containing graphene can be formed, for example, by reducing a film containing graphene oxide formed over a film of an insulator, a conductor, or the like.

The liquid crystal element 4013 can be a liquid crystal element using a fringe field switching (FFS) mode, for example. In general, a liquid crystal material is classified into a positive liquid crystal material with a positive dielectric anisotropy ($\Delta\varepsilon$) and a negative liquid crystal material with a negative dielectric anisotropy. Both of the materials can be used for the liquid crystal element 4013 in this embodiment, and an optimal liquid crystal material can be selected according to the employed mode and design.

In the display device in this embodiment, a negative liquid crystal material is preferably used. The negative liquid crystal is less affected by a flexoelectric effect, which is attributed to the polarization of liquid crystal molecules, and thus the polarity makes little difference in transmittance. This prevents flickering from being recognized by the user of the display device. The flexoelectric effect is a phenomenon in which polarization is induced by the distortion of orientation, and mainly depends on the shape of a molecule. The negative liquid crystal material is less likely to experience the deformation such as spreading and bending.

Note that the liquid crystal element 4013 is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned microcell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, a VA-IPS mode, or a guest-host mode can be used.

The display device described in this embodiment may be a normally black liquid crystal display device such as a transmissive liquid crystal display device utilizing a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element is an element that controls transmission and non-transmission of light by optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on the condition.

Although a display device including a liquid crystal element with a vertical electric field mode is illustrated in the example of FIG. 11, one embodiment of the present invention can be applied to a display device including a liquid crystal element with a horizontal electric field mode. In the case of employing a horizontal electric field mode, liquid crystal exhibiting a blue phase for which an alignment film is unnecessary may be used. The blue phase is one of liquid crystal phases, which is generated just before a cholesteric phase changes into an isotropic phase while the temperature of cholesteric liquid crystal is increased. Since the blue phase is only generated within a narrow temperature range, a liquid crystal composition containing a chiral material at 5 wt % or more is used for the liquid crystal layer 4008 in order to increase the temperature range. The liquid crystal composition that contains liquid crystal exhibiting a blue phase and a chiral material has a short response time and exhibits optical isotropy. In addition, the liquid crystal composition that contains liquid crystal exhibiting a blue phase and a chiral material does not need the alignment process and has little viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

A black matrix (a light-blocking layer); a coloring layer (a color filter); an optical member (an optical substrate) such as a polarizing member, a retardation member, or an antireflection member; or the like may be provided appropriately as needed. For example, circular polarization may be employed by using a polarizing substrate and a retardation substrate. In addition, a backlight unit, a side light unit, or the like may be used as a light source. A micro LED or the like may be used as the backlight unit or side light unit. In the case of the display device illustrated in FIG. 11, for example, a polarizing substrate may be provided on each of the surface of the second substrate 4006 (the surface on the side opposite to the side where a coloring layer 4131 and a light-blocking layer 4132 are provided) and the rear surface of the first substrate 4001 (the surface on the side opposite to the side where the insulating layer 4102 is provided), and a backlight unit may be provided on the rear surface of the first substrate 4001 with the polarizing substrate between the backlight unit and the first substrate 4001 (not illustrated).

In the display device illustrated in FIG. 11, the light-blocking layer 4132, the coloring layer 4131, and an insulating layer 4133 are provided between the second substrate 4006 and the second electrode layer 4031.

Examples of a material that can be used for the light-blocking layer 4132 include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer 4131 can also be used for the light-blocking layer 4132. For example, a layered structure of a film containing a material for the coloring layer 4131 which transmits light of a certain color and a film containing a material for the coloring layer 4131 which transmits light of another color can be employed. It is preferable that the coloring layer 4131 and the light-blocking layer 4132 be formed using the same material because the same manufacturing apparatus can be used and the process can be simplified.

As examples of a material that can be used for the coloring layer 4131, a metal material, a resin material, and a resin material containing a pigment or dye can be given. The light-blocking layer and the coloring layer may be formed by a method similar to the above-described methods for forming the layers. For example, an inkjet method may be used.

The insulating layer 4133 is preferably an overcoat having a planarization function. With the planarization function of the insulating layer 4133, a flat insulating film can be formed over a formation surface of the coloring layer 4131 and the light-blocking layer 4132 each having a different thickness. Since the second electrode layer 4031 can be formed flat owing to the insulating layer 4133 which is planarized, a thickness variation of the liquid crystal layer 4008 can be reduced. An acrylic resin or the like can be given as an example of such an insulating layer 4133.

Although the structure examples of the display device are described in this embodiment, a circuit configuration, a circuit element, or the like may be changed as appropriate depending on circumstances. For example, since the transistor is easily broken by static electricity or the like, a protective circuit for protecting the driver circuit may be provided. In addition, the protective circuit is preferably formed using a nonlinear element.

Note that this embodiment can be combined with any of the other embodiments in this specification as appropriate.

Embodiment 3

In this embodiment, the structure of a transistor that can be used in a semiconductor device or a display device of one embodiment of the present invention will be described.

The semiconductor device or the display device of one embodiment of the present invention can be fabricated using a transistor with any of various modes, such as a bottom-gate transistor or a top-gate transistor.

Bottom-Gate Transistor

FIG. 12A1 is a cross-sectional view of a channel-protective transistor 810 that is a kind of bottom-gate transistor. In FIG. 12A1, the transistor 810 is formed over a substrate 771. The transistor 810 includes an electrode 746 over the substrate 771 with an insulating layer 772 therebetween. The transistor 810 includes a semiconductor layer 742 over the electrode 746 with an insulating layer 726 therebetween. The electrode 746 can serve as a gate electrode, and the insulating layer 726 can serve as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can serve as one of a source electrode and a drain electrode. The electrode 744b can serve as the other of the source electrode and the drain electrode. Part of the electrode 744a and part of the electrode 744b are formed over the insulating layer 741.

The insulating layer 741 can serve as a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for regions of the electrodes 744a and 744b that are in contact with the semiconductor layer 742. The carrier concentration in the regions of the semiconductor layer 742 where oxygen vacancies are generated is increased, so that the regions become n-type regions (referred to as $n^+$ regions in some cases). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrodes 744a and 744b. Accordingly, the electrical characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and each of the electrodes 744a and 744b. The layer that serves as an n-type semiconductor or a p-type semiconductor can serve as the source region or the drain region in the transistor.

The insulating layer 729 is preferably formed using a material that can prevent or reduce diffusion of impurities into the transistor from the outside. The insulating layer 729 is not necessarily formed.

A transistor 811 illustrated in FIG. 12A2 is different from the transistor 810 in including, over the insulating layer 729, an electrode 723 that can serve as a back gate electrode. The electrode 723 can be formed using a material and a method similar to those of the electrode 746.

In general, a back gate electrode is formed using a conductive layer and positioned so that a channel formation region in a semiconductor layer is positioned between a gate electrode and the back gate electrode. Thus, the back gate electrode can serve in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each serve as a gate electrode. Thus, the insulating layers 726, 728, and 729 can each serve as a gate insulating layer. The electrode 723 may be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrodes 746 and 723 may be referred to as a "first gate electrode", and the other may be referred to as a "second gate electrode".

By providing the electrodes 746 and 723 with the semiconductor layer 742 therebetween and setting the potentials of the electrodes 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel formation region is formed (in particular, an electric field blocking function against static electricity and the like). When the back gate electrode is formed to be larger than the semiconductor layer to cover the semiconductor layer, the electric field blocking function can be enhanced.

When the back gate electrode is formed using a light-blocking conductive film, light can be prevented from entering the semiconductor layer from the back gate electrode side. Therefore, photodegradation of the semiconductor layer and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 12B1 is a cross-sectional view of a channel-protective transistor 820 that is a type of bottom-gate transistor. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 that overlaps with the semiconductor layer 742. The semiconductor layer 742 is electrically connected to the electrode 744b in another opening formed by selectively removing part of the insulating layer 741 that overlaps with the semiconductor layer 742. A region of the insulating layer 741 that overlaps with the channel formation region can serve as a channel protective layer.

A transistor 821 illustrated in FIG. 12B2 is different from the transistor 820 in including, over the insulating layer 729, the electrode 723 that serves as a back gate electrode.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The length between the electrode 744a and the electrode 746 and the length between the electrode 744b and the electrode 746 in the transistors 820 and 821 are larger than those in the transistors 810 and 811. Thus, the parasitic capacitance generated between the electrode 744a and the electrode 746 can be reduced. The parasitic capacitance generated between the electrode 744b and the electrode 746 can also be reduced. According to one embodiment of the present invention, a transistor with favorable electrical characteristics can be provided.

A transistor 825 illustrated in FIG. 12C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 12C2 is different from the transistor 825 in that the electrode 723 that can serve as a back gate electrode is provided over the insulating layer 729.

Top-Gate Transistor

A transistor 842 illustrated in FIG. 13A1 is a type of top-gate transistor. The transistor 842 is different from the transistors 810, 811, 820, 821, 825, and 826 in that the electrodes 744a and 744b are formed after the insulating layer 729 is formed. The electrodes 744a and 744b are electrically connected to the semiconductor layer 742 through openings formed in the insulating layers 728 and 729.

Part of the insulating layer 726 that does not overlap with the electrode 746 is removed, and an impurity 755 is introduced into the semiconductor layer 742 using, as a mask, the electrode 746 and the insulating layer 726 that is left, so that an impurity region can be formed in the semiconductor layer 742 in a self-aligned manner (FIG. 13A3). The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. A lightly doped drain (LDD) region is formed in a region of the semiconductor layer 742 which does not overlap with the electrode 746.

A transistor 843 illustrated in FIG. 13A2 is different from the transistor 842 in including the electrode 723. The transistor 843 includes the electrode 723 that is formed over the substrate 771. The electrode 723 has a region overlapping with the semiconductor layer 742 with the insulating layer 772 therebetween. The electrode 723 can serve as a back gate electrode.

As in a transistor 844 illustrated in FIG. 13B1 and a transistor 845 illustrated in FIG. 13B2, the insulating layer 726 in a region that does not overlap with the electrode 746 may be completely removed. Alternatively, as in a transistor 846 illustrated in FIG. 13C1 and a transistor 847 illustrated in FIG. 13C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner (FIG. 13A3). According to one embodiment of the present invention, a transistor with favorable electrical characteristics can be provided. According to one embodiment of the present invention, a semiconductor device having a high degree of integration can be provided.

Note that this embodiment can be combined with any of the other embodiments in this specification as appropriate.

Embodiment 4

In this embodiment, the compositions of a cloud-aligned composite oxide semiconductor (CAC-OS) and a c-axis aligned crystalline oxide semiconductor (CAAC-OS) which are metal oxides that can be used in the OS transistor described in the above embodiment will be described. Note that in this specification and the like, CAC refers to an example of a function or a material composition, and CAAC refers to an example of a crystal structure.

Composition of Metal Oxide

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

Structure of Metal Oxide

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, formation of a grain boundary is inhibited because of the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. Also, when indium in the In layer is replaced with the element M, the layer can be referred to as an (In,M) layer.

The CAAC-OS is an oxide semiconductor with high crystallinity. On the other hand, in the CAAC-OS, a clear grain boundary cannot be observed; thus, a reduction in electron mobility due to the grain boundary is less likely to occur. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Therefore, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

Transistor Including Oxide Semiconductor

Next, the case where the oxide semiconductor is used for a transistor will be described.

Note that when the oxide semiconductor is used for a transistor, the transistor can have high field-effect mobility. In addition, the transistor can have high reliability.

An oxide semiconductor with low carrier density is preferably used for the transistor. In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, a transistor having a channel formation region in an oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is also preferably reduced. As examples of the impurities, hydrogen, nitrogen, alkali metal, alkaline earth metal, iron, nickel, silicon, and the like are given.

Impurity

Here, the influence of impurities in the oxide semiconductor will be described.

When silicon or carbon, which is one of Group 14 elements, is contained in the oxide semiconductor, defect states are formed. Thus, the concentration of silicon or carbon in the oxide semiconductor and around an interface with the oxide semiconductor (measured by secondary ion mass spectrometry (SIMS)) is set to lower than or equal to $2 \times 10^{18}$ atoms/cm$^3$, preferably lower than or equal to $2 \times 10^{17}$ atoms/cm$^3$.

When the oxide semiconductor contains alkali metal or alkaline earth metal, defect states are formed and carriers are generated in some cases. Thus, a transistor including an oxide semiconductor that contains alkali metal or alkaline earth metal is likely to be normally on. Therefore, it is preferable to reduce the concentration of alkali metal or alkaline earth metal of the oxide semiconductor. Specifically, the concentration of alkali metal or alkaline earth metal in the oxide semiconductor measured by SIMS is set to lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type because of generation of electrons serving as carriers and an increase in carrier density. Thus, a transistor whose semiconductor includes an oxide semiconductor that contains nitrogen is likely to be normally on. For this reason, the amount of nitrogen in the oxide semiconductor is preferably reduced as much as possible; the nitrogen concentration of the oxide semiconductor measured by SIMS is set to, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. Accordingly, it is preferable that the amount of hydrogen in the oxide semiconductor be reduced as much as possible. Specifically, the hydrogen concentration of the oxide semiconductor measured by SIMS is set to lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

Note that this embodiment can be combined with any of the other embodiments as appropriate.

Embodiment 5

In this embodiment, examples of a product in which the semiconductor device or the display device described in the above embodiments is used for an electronic device will be described.

Laptop Personal Computer

Figure 14A:
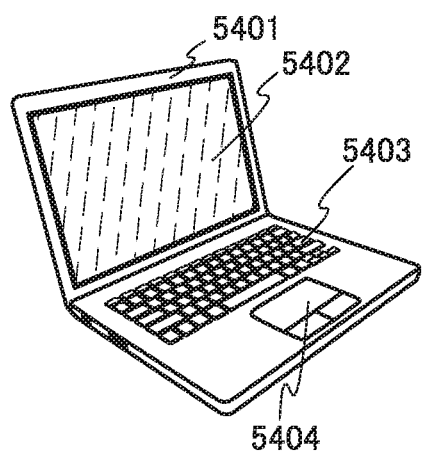
FIGS. 14A to 14F are perspective views each illustrating an example of an electronic device.

The semiconductor device or the display device of one embodiment of the present invention can be used for a display provided in an information terminal device. FIG. 14A illustrates a laptop personal computer that is a kind of information terminal device. The laptop personal computer includes a housing 5401, a display portion 5402, a keyboard 5403, a pointing device 5404, and the like.

Smart Watch

Figure 14B:
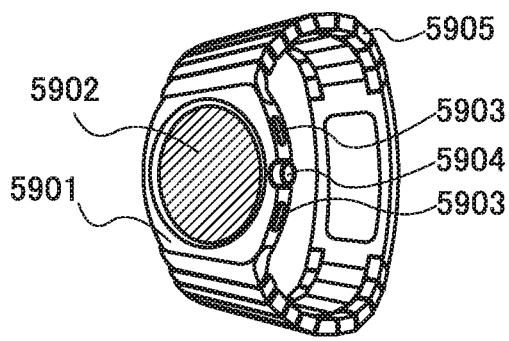

The semiconductor device or the display device of one embodiment of the present invention can be used for a wearable terminal. FIG. 14B illustrates a smart watch that is a kind of wearable terminal. The smart watch includes a housing 5901, a display portion 5902, operation buttons 5903, an operator 5904, a band 5905, and the like. A display device with a position input function may be used for the display portion 5902. The position input function can be added by provision of a touch panel in a display device. Alternatively, the position input function can be added by provision of a photoelectric conversion element also called a photosensor in a pixel area of a display device. As the operation buttons 5903, any of a power switch for activating the smart watch, a button for operating an application of the smart watch, a volume control button, a switch for turning on or off the display portion 5902, and the like can be provided. Although the smart watch illustrated in FIG. 14B includes two operation buttons 5903, the number of operation buttons included in the smart watch is not limited to two. The operator 5904 functions as a crown used for setting the time on the smart watch. The operator 5904 may be used as an input interface for operating an application of the smart watch as well as the crown for time adjustment. Although the smart watch in FIG. 14B includes the operator 5904, one embodiment of the present invention is not limited thereto and does not necessarily include the operator 5904.

Video Camera

Figure 14C:
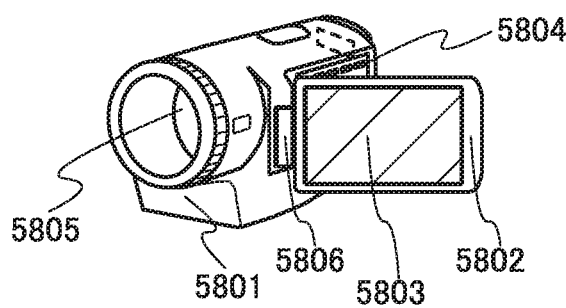

The semiconductor device or the display device of one embodiment of the present invention can be used for a video camera. FIG. 14C illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Mobile Phone

Figure 14D:
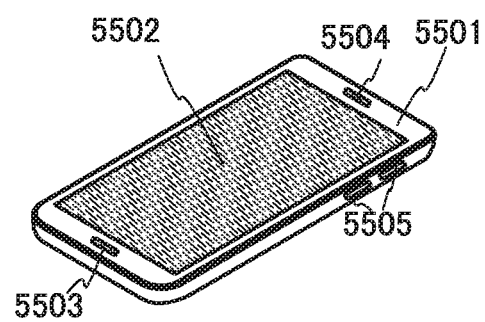

The semiconductor device or the display device of one embodiment of the present invention can be used for a mobile phone. FIG. 14D illustrates a mobile phone having a function of an information terminal. The mobile phone includes a housing 5501, a display portion 5502, a microphone 5503, a speaker 5504, and operation buttons 5505. A display device with a position input function may be used for the display portion 5502. The position input function can be added by provision of a touch panel in a display device. Alternatively, the position input function can be added by provision of a photoelectric conversion element also called a photosensor in a pixel area of a display device. As the operation buttons 5505, any of a power switch for activating the mobile phone, a button for operating an application of the mobile phone, a volume control button, a switch for turning on or off the display portion 5502, and the like can be provided.

Although the mobile phone illustrated in FIG. 14D includes two operation buttons 5505, the number of operation buttons included in the mobile phone is not limited to two. Although not illustrated, the mobile phone illustrated in FIG. 14D may include a light-emitting device used for a flashlight or a lighting purpose.

Television Device

Figure 14E:
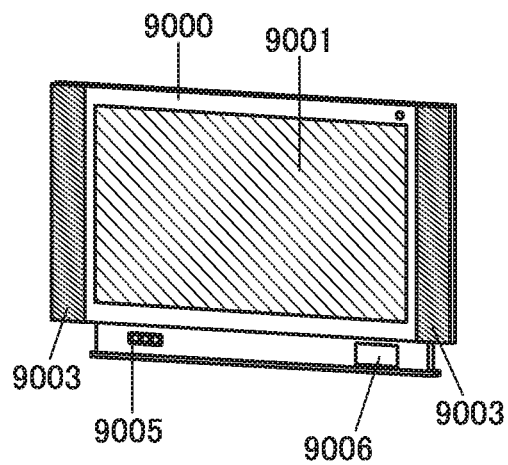

The semiconductor device or the display device of one embodiment of the present invention can be used for a television device. FIG. 14E illustrates a television device including a housing 9000, a display portion 9001, a speaker 9003, an operation key 9005 (including a power switch or an operation switch), a connection terminal 9006, and the like. The television device can include the display portion 9001 having a large screen size of 50 inches or more or 100 inches or more, for example.

Vehicle

The semiconductor device or the display device of one embodiment of the present invention can be used around a driver's seat in a car, which is a vehicle.

Figure 14F:
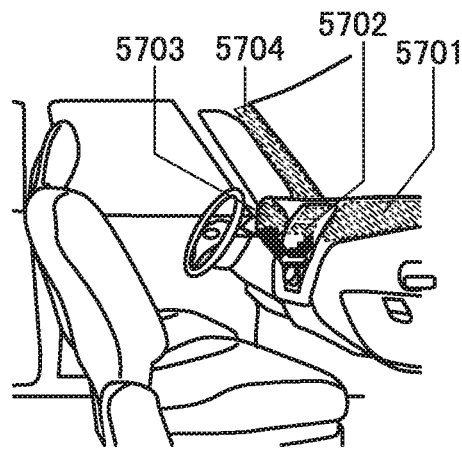

As an example, FIG. 14F illustrates a windshield and its vicinity inside a car. FIG. 14F shows a display panel 5701, a display panel 5702, and a display panel 5703 that are attached to a dashboard and a display panel 5704 that is attached to a pillar.

The display panels 5701 to 5703 can provide a variety of kinds of information such as navigation information, a speedometer, a tachometer, a mileage, a fuel meter, a gearshift indicator, and air-condition setting. Items shown on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by showing an image taken by an imaging unit provided for the car body. That is, displaying an image taken by the imaging unit provided on the outside of the car body leads to elimination of blind areas and enhancement of safety. Moreover, showing an image to compensate for the area that a driver cannot see makes it possible for the driver to confirm safety more easily and comfortably. The display panel 5704 can also be used as a lighting device.

Electronic Device for Electronic Advertisement

Figure 15A:
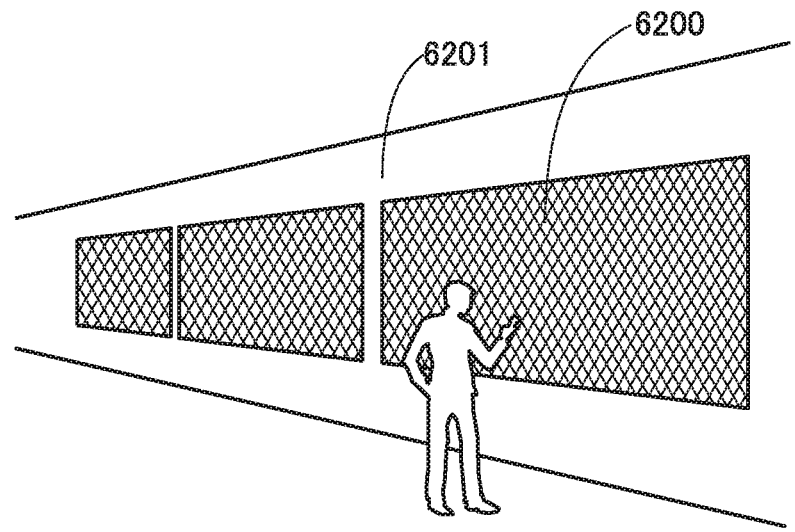
FIGS. 15A and 15B are perspective views each illustrating an example of an electronic device.

The semiconductor device or the display device of one embodiment of the present invention can be used for a display used for an electronic advertisement. FIG. 15A shows an example of digital signage that can be attached to a wall. FIG. 15A illustrates a digital signage 6200 attached to a wall 6201.

Foldable Tablet Information Terminal

Figure 15B:
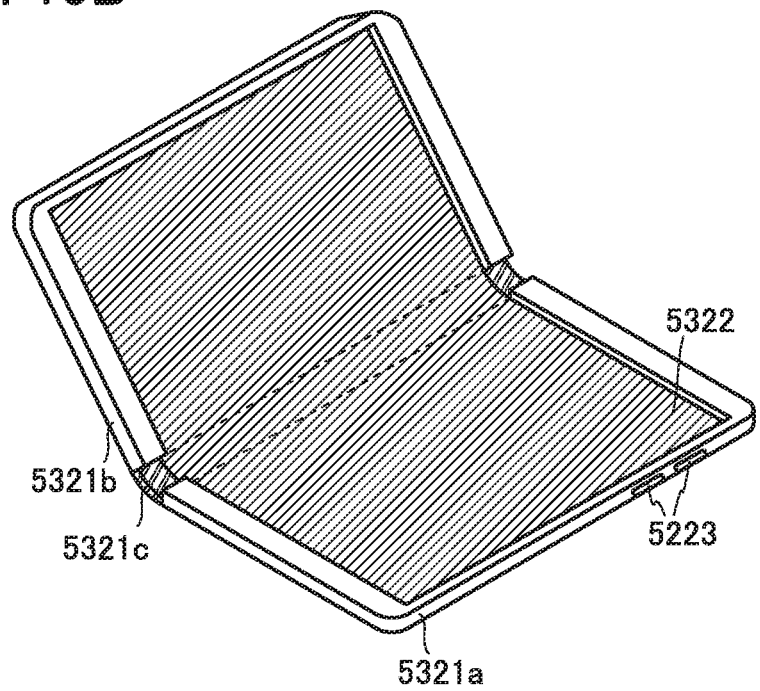

The semiconductor device or the display device of one embodiment of the present invention can be used for a tablet information terminal. FIG. 15B illustrates a foldable tablet information terminal including a housing 5321*a*, a housing 5321*b*, a display portion 5322, and operation buttons 5323. The display portion 5322 particularly includes a flexible base, which allows the display portion 5322 to be folded.

The housing 5321*a* and the housing 5321*b* are connected to each other with a hinge portion 5321*c* that allows the display portion 5322 to be folded in half. The display portion 5322 is provided in the housing 5321*a* and the housing 5321*b* and over the hinge portion 5321*c*.

Although not illustrated, each of the electronic devices illustrated in FIGS. 14A to 14C and 14E and FIGS. 15A and 15B may include a microphone and a speaker. The electronic device with this structure can have an audio input function, for example.

Although not illustrated, each of the electronic devices illustrated in FIGS. 14A, 14B, and 14D and FIGS. 15A and 15B may include a camera.

Although not illustrated, each of the electronic devices in FIGS. 14A to 14F and FIGS. 15A and 15B may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing. In particular, when the mobile phone in FIG. 14D is provided with a sensing device that includes a sensor for sensing inclination, such as a gyroscope sensor or an acceleration sensor, the orientation of the mobile phone (with respect to the vertical direction) can be determined to change the display on the screen of the display portion 5502 automatically in accordance with the orientation of the mobile phone.

Although not illustrated, each of the electronic devices in FIGS. 14A to 14F and FIGS. 15A and 15B may include a device for obtaining biological information such as fingerprints, veins, iris, or voice prints. The electronic device with this structure can have a biometric identification function.

A flexible base may be used for the display portion of each of the electronic devices in FIGS. 14A to 14E and FIG. 15A. Specifically, the display portion may have a structure in which a transistor, a capacitor, a display element, and the like are provided over a flexible base. With such a structure, in addition to the electronic device having the housing with a flat surface as illustrated in FIGS. 14A to 14E and FIG. 15A, an electronic device having a housing with a curved surface like the dashboard and the pillar illustrated in FIG. 14F can be obtained.

As a flexible base that can be used for each of the display portions in FIGS. 14A to 14F and FIGS. 15A and 15B, any of the following materials that transmit visible light can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, and the like. Alternatively, a mixture or a stack including any of these materials may be used.

Note that this embodiment can be combined with any of the other embodiments in this specification as appropriate.

Notes on Description of this Specification and the Like

The following are notes on the structures in the above embodiments.

Notes on One Embodiment of the Present Invention Described in Embodiments

One embodiment of the present invention can be constituted by appropriately combining the structure described in an embodiment with any of the structures described in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text disclosed in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

Notes on Ordinal Numbers

In this specification and the like, ordinal numbers such as first, second, and third are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

Notes on Description for Drawings

The embodiments are described with reference to the drawings. Note that the embodiments can be implemented in many different modes, and it will be readily appreciated by those skilled in the art that modes and details can be changed in various ways without departing from the spirit and scope of the present invention. Thus, the present invention should not be interpreted as being limited to the description of the embodiments. Note that in the structures of the invention described in Embodiments, the same portions or portions having similar functions are denoted by the same reference numerals in different drawings, and the description of such portions is not repeated.

In this specification and the like, terms for explaining arrangement (e.g., over, above, under, and below) are used for convenience to indicate a positional relation between components with reference to drawings. The positional relation between components is changed as appropriate in accordance with a direction in which the components are described. Therefore, the terms for explaining arrangement are not limited to those used in the specification and the like, and can be changed to other terms as appropriate depending on the situation. For example, the expression "an insulator over (on) a top surface of a conductor" can be replaced with the expression "an insulator on a bottom surface of a conductor" when the direction of a diagram showing these components is rotated by 180°.

The term such as "over", "above", "under", or "below" does not necessarily mean that a component is placed directly on or under and directly in contact with another component. For example, the expression "an electrode B over an insulating layer A" does not necessarily mean that the electrode B is on and in direct contact with the insulating layer A and can also mean the case where another component is provided between the insulating layer A and the electrode B.

In the drawings, the size, the layer thickness, or the region is determined arbitrarily for description convenience; therefore, embodiments of the present invention are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some of components might not be illustrated for clarity of the drawings.

In the drawings, the same components, components having similar functions, components formed of the same material, or components formed at the same time are sometimes denoted by the same reference numerals, and the description thereof is not repeated in some cases.

Notes on Expressions that can be Rephrased

In this specification and the like, the terms "one of a source and a drain" (or a first electrode or a first terminal) and "the other of the source and the drain" (or a second electrode or a second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, a channel formation region refers to a region where a channel is formed; the formation of this region by application of a potential to the gate enables current to flow between the source and the drain.

Functions of a source and a drain are sometimes switched when a transistor of different polarity is employed or when a direction of current flow is changed in circuit operation, for example. Therefore, the terms "source" and "drain" can be used interchangeably in this specification and the like.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other as appropriate. The term "voltage" refers to a potential difference from a reference potential. When the reference potential is a ground potential, for example, "voltage" can be replaced with "potential". A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, in some cases, the term "conductive film" can be used instead of "conductive layer", and the term "insulating layer" can be used instead of "insulating film". Moreover, such terms can be replaced with a word not including the term "film" or "layer" depending on the case or circumstances. For example, in some cases, the term "conductor" can be used instead of "conductive layer" or "conductive film", and the term "insulator" can be used instead of "insulating layer" or "insulating film".

In this specification and the like, the terms "wiring", "signal line", "power supply line", and the like can be replaced with each other depending on the case or circumstances. For example, in some cases, the term "signal line" or "power supply line" can be used instead of "wiring", and vice versa. In some cases, the term "signal line" can be used instead of "power supply line", and vice versa. As another example, the term "signal" can be used instead of "potential" that is supplied to a wiring and vice versa, depending on the case or circumstances.

Notes on Definitions of Terms

The following are definitions of the terms mentioned in the above embodiments.

Impurities in Semiconductor

Impurities in a semiconductor refer to, for example, elements other than the main components of a semiconductor layer. For instance, an element with a concentration of lower than 0.1 atomic % is an impurity. If impurities are contained in a semiconductor, the density of states (DOS) may be formed in the semiconductor, the carrier mobility may be decreased, or the crystallinity may be decreased, for example. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the semiconductor layer. Specific examples are hydrogen (included also in water), lithium, sodium, silicon, boron, phosphorus, carbon, and nitrogen. When the semiconductor is an oxide semiconductor, oxygen vacancies may be formed by entry of impurities such as hydrogen, for instance. When the semiconductor is a silicon layer, examples of impurities that change the characteristics of the semiconductor include oxygen, Group 1 elements except hydrogen, Group 2 elements, Group 13 elements, and Group 15 elements.

Switch

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the on state of the transistor refers to a state in which a source electrode and a drain electrode of the transistor are regarded as being electrically short-circuited. The off state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology, such as a digital micromirror device (DMD). Such a switch includes an electrode that can be moved mechanically, and its conduction and non-conduction is controlled with movement of the electrode.

Connection

In this specification and the like, the description "X and Y are connected" means that X and Y are electrically connected, X and Y are functionally connected, and X and Y are directly connected. Accordingly, without being limited to a predetermined connection relation (e.g., a connection relation shown in drawings and texts), another connection relation is regarded as being included in the drawings and the texts.

Here, X and Y each denote an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not.

For example, in the case where X and Y are functionally connected, at least one circuit that enables functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are regarded as being functionally connected when a signal output from X is transmitted to Y.

Note that an explicit description "X and Y are electrically connected" means that X and Y are electrically connected (i.e., X and Y are connected with another element or circuit provided therebetween), X and Y are functionally connected (i.e., X and Y are functionally connected with another circuit provided therebetween), and X and Y are directly connected (i.e., X and Y are connected without another element or circuit provided therebetween). That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also serves as an electrode, one conductive film serves as the wiring and the electrode. Thus, the term "electrical connection" in this specification also means such a case where one conductive film has functions of a plurality of components.

Parallel and Perpendicular

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

REFERENCE NUMERALS

DD: display device, PA: display portion, GD: gate driver circuit, SD: source driver circuit, PIX: pixel, SR: shift register, LAT: latch circuit, LVS: level shifter circuit, DAC: D/A converter circuit, AMP: amplifier circuit, GL: wiring, SL: wiring, DB: data bus wiring, Tr1: transistor, Tr2: transistor, Tr3: transistor, Tr4: transistor, Try: transistor, C1: capacitor, C2: capacitor, GL1: wiring, GL2: wiring, GL3: wiring, DL: wiring, WDL: wiring, AL: wiring, VL: wiring, CAT: wiring, VCOM: wiring, ND1: node, ND2: node, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 4001: first substrate, 4005: sealant, 4006: second substrate, 4010: transistor, 4011: transistor, 4014: wiring, 4015: electrode, 4017: electrode, 4018: FPC, 4019: anisotropic conductive layer, 4020: capacitor, 4021: electrode, 4030: first electrode layer, 4031: second electrode layer, 4032: insulating layer, 4033: insulating layer, 4041: printed circuit board, 4042: integrated circuit, 4102: insulating layer, 4103: insulating layer, 4110: insulating layer, 4111: insulating layer, 4112: insulating layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4510: bank, 5321a: housing, 5321b: housing, 5321c: hinge portion, 5322: display portion, 5323: operation button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint, 5901: housing, 5902: display portion, 5903: operation button, 5904: operator, 5905: band, 6200: digital signage, 6201: wall, 9000: housing, 9001: display portion, 9003: speaker, 9005: operation key, 9006: connection terminal This application is based on Japanese Patent Application Serial No. 2017-216032 filed with Japan Patent Office on Nov. 9, 2017 and Japanese Patent Application Serial No. 2017-225265 filed with Japan Patent Office on Nov. 23, 2017, the entire contents of which are hereby incorporated by reference.

The invention claimed is:

1. A semiconductor device comprising:
a first transistor;
a second transistor;
a third transistor;
a first capacitor; and
a second capacitor,
wherein a first terminal of the first transistor is electrically connected to a first terminal of the first capacitor,
wherein a first terminal of the second transistor is electrically connected to a gate of the third transistor, a second terminal of the first capacitor, and a first terminal of the second capacitor,
wherein a first terminal of the third transistor is electrically connected to a second terminal of the second capacitor,
wherein the semiconductor device comprises first to fourth functions:
the first function comprises:
a function of writing a first potential to the first terminal of the first capacitor by turning on the first transistor; and
a function of writing a second potential to the gate of the third transistor, the second terminal of the first capacitor, and the first terminal of the second capacitor by turning on the second transistor,
the second function comprises a function of holding the second potential of the gate of the third transistor at the second terminal of the first capacitor and the first terminal of the second capacitor by turning off the second transistor,
the third function comprises:
a function of writing a sum of the first potential and a third potential to the first terminal of the first capacitor; and
a function of changing the second potential held at the gate of the third transistor to a sum of the second potential and a fourth potential when the sum of the first potential and the third potential is written to the first terminal of the first capacitor,
the fourth function comprises a function of supplying a current corresponding to the sum of the second potential and the fourth potential between the first terminal and a second terminal of the third transistor,
wherein the second potential corresponds to upper bits of data, and
wherein the fourth potential corresponds to lower bits of data.

2. The semiconductor device according to claim 1, wherein at least one of the first to third transistors includes a metal oxide in a channel formation region.

3. The semiconductor device according to claim 1, further comprising:
a fourth transistor; and
a light-emitting element,
wherein a first terminal of the fourth transistor is electrically connected to the first terminal of the third transistor and the second terminal of the second capacitor, and
wherein an input terminal of the light-emitting element is electrically connected to a second terminal of the fourth transistor.

4. The semiconductor device according to claim 3, wherein the fourth transistor includes a metal oxide in a channel formation region.

5. A display device comprising:
the semiconductor device according to claim 1; and
a D/A converter circuit,
wherein an output terminal of the D/A converter circuit is electrically connected to the first terminal of the first transistor and the first terminal of the second transistor, and
wherein the D/A converter circuit is configured to generate the first potential, the second potential, or a sum of the first potential and the third potential and output the first potential, the second potential, or the sum of the first potential and the third potential from the output terminal of the D/A converter circuit.

6. An electronic device comprising:
the display device according to claim 5; and
a housing.

7. A semiconductor device comprising:
a first transistor;
a second transistor;
a first capacitor; and
a second capacitor,
wherein a first terminal of the first transistor is electrically connected to a first terminal of the first capacitor,
wherein a first terminal of the second transistor is electrically connected to a second terminal of the first capacitor and a first terminal of the second capacitor,
wherein the semiconductor device comprises first to third functions:
the first function comprises:
a function of writing a first potential to the first terminal of the first capacitor by turning on the first transistor; and
a function of writing a second potential to the second terminal of the first capacitor and the first terminal of the second capacitor by turning on the second transistor,
the second function comprises a function of holding the second potential of the second terminal of the first capacitor and the first terminal of the second capacitor by turning off the second transistor,
the third function comprises:
a function of writing a sum of the first potential and a third potential to the first terminal of the first capacitor; and
a function of changing the second potential held at the second terminal of the first capacitor and the first terminal of the second capacitor to a sum of the second potential and a fourth potential when the sum of the first potential and the third potential is written to the first terminal of the first capacitor,
wherein the second potential corresponds to upper bits of data, and
wherein the fourth potential corresponds to lower bits of data.

8. The semiconductor device according to claim 7, wherein at least one of the first and second transistors includes a metal oxide in a channel formation region.

9. The semiconductor device according to claim 7, further comprising:
a liquid crystal element,
wherein an input terminal of the liquid crystal element is electrically connected to the first terminal of the second transistor.

10. A display device comprising:
the semiconductor device according to claim 7; and
a D/A converter circuit,
wherein an output terminal of the D/A converter circuit is electrically connected to the first terminal of the first transistor and the first terminal of the second transistor, and
wherein the D/A converter circuit is configured to generate the first potential, the second potential, or a sum of the first potential and the third potential and output the first potential, the second potential, or the sum of the first potential and the third potential from the output terminal of the D/A converter circuit.

11. An electronic device comprising:
the display device according to claim 10; and
a housing.

* * * * *